(12) United States Patent
Kikuchi et al.

(10) Patent No.: US 12,224,020 B2
(45) Date of Patent: Feb. 11, 2025

(54) SEMICONDUCTOR STORAGE DEVICE AND MEMORY SYSTEM

(71) Applicant: Kioxia Corporation, Tokyo (JP)

(72) Inventors: Kenro Kikuchi, Fujisawa Kanagawa (JP); Masahiko Iga, Yokohama Kanagawa (JP); Nobushi Matsuura, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 243 days.

(21) Appl. No.: 17/902,754

(22) Filed: Sep. 2, 2022

(65) Prior Publication Data

US 2023/0317181 A1     Oct. 5, 2023

(30) Foreign Application Priority Data

Mar. 16, 2022 (JP) ................. 2022-041744

(51) Int. Cl.

| G11C 16/16 | (2006.01) |
|---|---|
| G11C 16/08 | (2006.01) |
| G11C 16/24 | (2006.01) |
| G11C 16/34 | (2006.01) |

(52) U.S. Cl.
CPC .......... *G11C 16/3445* (2013.01); *G11C 16/08* (2013.01); *G11C 16/16* (2013.01); *G11C 16/24* (2013.01)

(58) Field of Classification Search
CPC ..... G11C 16/3445; G11C 16/08; G11C 16/16; G11C 16/24; G11C 16/0483
USPC ...................................... 365/185.22
See application file for complete search history.

(56) References Cited

U.S. PATENT DOCUMENTS

| 9,368,220 B2 | 6/2016 | Hung et al. |
| 10,658,045 B1 | 5/2020 | Yang et al. |
| 10,878,916 B2 | 12/2020 | Liao et al. |
| 2015/0221380 A1* | 8/2015 | Lee ......... G11C 16/14 365/185.11 |
| 2017/0125116 A1* | 5/2017 | Shim ........ G11C 16/16 |
| 2021/0280260 A1* | 9/2021 | Shiino ....... G11C 16/344 |

* cited by examiner

*Primary Examiner* — Hoai V Ho
(74) *Attorney, Agent, or Firm* — Holtz, Holtz & Volek PC

(57) ABSTRACT

A semiconductor storage device of embodiments includes a block constituted with a plurality of strings each including a plurality of memory cell transistors, a plurality of word lines, a bit line, a source line, and a control circuit configured to perform erase operation on the plurality of memory cell transistors, and the control circuit changes setting of first erase-verify operation included in the erase operation for an open block including a memory cell transistor having an erase level and setting of second erase-verify operation included in erase operation for a closed block not including a memory cell transistor having an erase block.

17 Claims, 15 Drawing Sheets

SEMICONDUCTOR STORAGE DEVICE AND MEMORY SYSTEM

CROSS-REFERENCE TO RELATED APPLICATION

This application is based upon and claims the benefit of priority from the prior Japanese Patent Application No. 2022-041744 filed in Japan on Mar. 16, 2022; the entire contents of which are incorporated herein by reference.

FIELD

Embodiments described herein relate generally to a semiconductor storage device and a memory system.

BACKGROUND

In recent years, a NAND memory has been in widespread use as a semiconductor storage device.

Data erase of such a NAND memory is performed in units of blocks. To prevent degradation of characteristics of the NAND memory, it is desired to reduce cell stress also upon data erase.

DETAILED DESCRIPTION

A semiconductor storage device of embodiments includes a first memory block constituted with a plurality of first strings each including a first select transistor, a plurality of first memory cell transistors, and a second select transistor in this order; a second memory block constituted with a plurality of second strings each including a third select transistor, a plurality of second memory cell transistors, and a fourth select transistor in this order; and a control circuit configured to perform erase operation on the first memory block and the second memory block, wherein, when the first memory block is an open block including a memory cell transistor having a threshold of an erase level and the second memory block is a closed block not including the memory cell transistor having the threshold of the erase level, the control circuit changes setting of first erase-verify operation that is erase-verify operation included in the erase operation on the first memory block and setting of second erase-verify operation that is erase-verify operation included in the erase operation on the second memory block.

Embodiments of the present invention will be described in detail below with reference to the drawings.

First Embodiment

The present embodiment enables reliable erase while reducing cell stress by determining whether a block is an open block or a closed block upon execution of erase operation and changing setting upon erase-verify on the basis of a determination result to control ease of erase-verify pass.

(Configuration of Memory System)

Figure 1:
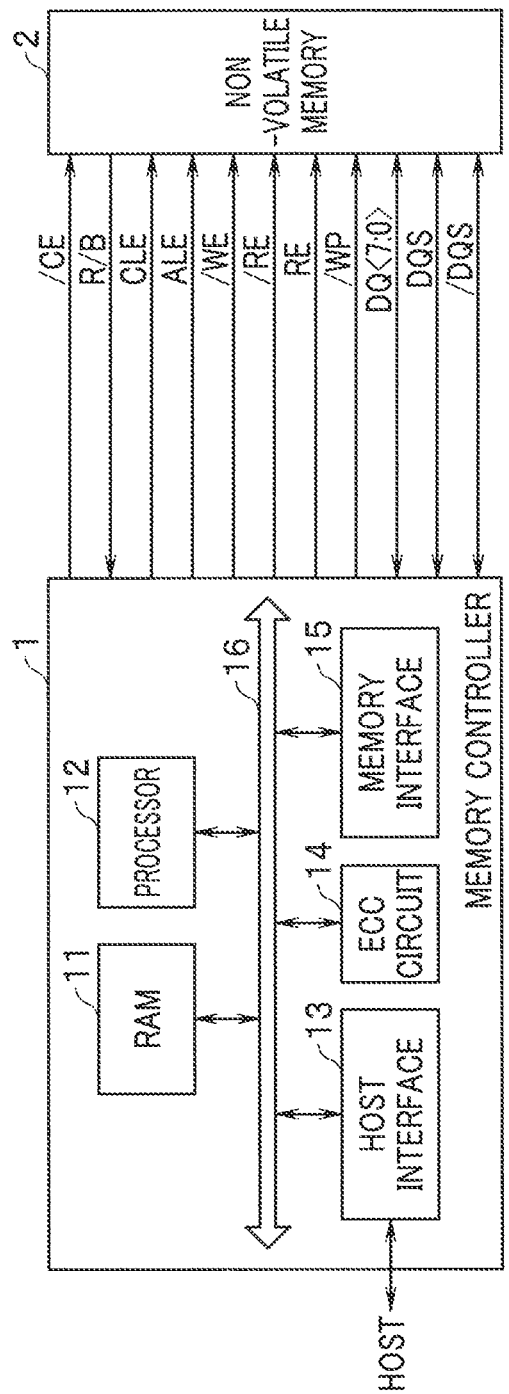
FIG. 1 is a block diagram illustrating a configuration example of a memory system according to an embodiment.

FIG. 1 is a block diagram illustrating a configuration example of a memory system according to the embodiment. The memory system of the present embodiment includes a memory controller 1 and a non-volatile memory 2. The memory system can be connected to a host. The host is, for example, electronic equipment such as a personal computer and a mobile terminal.

The non-volatile memory 2, which is a semiconductor storage device that stores data in a non-volatile manner, is, for example, constituted with a NAND memory. While in the present embodiment, the non-volatile memory 2 will be described as a NAND memory including memory cell transistors capable of storing 3 bits for each of the memory cell transistors, that is, a NAND memory of 3 bits per cell (TLC), the non-volatile memory 2 is not limited to such a NAND memory. The non-volatile memory 2 is constituted in three dimensions.

The memory controller 1 controls write of data in the non-volatile memory 2 in accordance with a write request from the host. Further, the memory controller 1 controls read of data from the non-volatile memory 2 in accordance with a read request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14 and the memory interface 15 are connected to one another with an internal bus 16.

The host interface 13 outputs the request received from the host, write data, and the like, to the internal bus 16. Further, the host interface 13 transmits data read from the non-volatile memory 2, a response from the processor 12, and the like, to the host.

The memory interface 15 controls processing of writing data, and the like, in the non-volatile memory 2 and processing of reading data, and the like, from the non-volatile memory 2 on the basis of an instruction from the processor 12.

The processor 12 comprehensively controls the memory controller 1. The processor 12 is, for example, a CPU (central processing unit) or an MPU (micro processing unit). In a case where the processor 12 receives a request from the host via the host interface 13, the processor 12 performs control in accordance with the request. For example, the processor 12 instructs the memory interface 15 to write data and a parity in the non-volatile memory 2 in accordance with the request from the host. Further, the processor 12 instructs the memory interface 15 to read data and a parity from the non-volatile memory 2 in accordance with the request from the host.

The processor 12 determines a storage area (hereinafter, referred to as a memory area) on the non-volatile memory 2 for data to be accumulated in the RAM 11. The data is stored in the RAM 11 by way of the internal bus 16. The processor 12 determines the memory area for data in page unit which is write unit, that is, page data. In the present specification, data to be stored in one page of the non-volatile memory 2 will be defined as unit data. The unit data is, for example, encoded and stored in the non-volatile memory 2 as a code word.

Note that encoding is not essential. While the memory controller 1 may store the unit data in the non-volatile memory 2 without being encoded, FIG. 1 illustrates a configuration where encoding is performed as one configuration example. In a case where the memory controller 1 does not perform encoding, the page data matches the unit data. Further, one code word may be generated on the basis of one piece of unit data or one code word may be generated on the basis of divided data obtained by dividing the unit data. Further, one code word may be generated using a plurality of pieces of unit data.

The processor 12 determines a memory area of the non-volatile memory 2 that is a write destination for each piece of unit data. Physical addresses are allocated to memory areas of the non-volatile memory 2. The processor 12 manages memory areas of write destinations of the unit data using the physical addresses. The processor 12 designates the physical address of the determined memory area and instructs the memory interface 15 to write data in the non-volatile memory 2. The processor 12 manages correspondence between logical addresses (logical addresses managed by the host) and physical addresses of data. In a case where the processor 12 receives a read request including a logical address from the host, the processor 12 specifies a physical address corresponding to the logical address, designates the physical address and instructs the memory interface 15 to read data.

The ECC circuit 14 encodes the data stored in the RAM 11 to generate a code word. Further, the ECC circuit 14 decodes a code word read from the non-volatile memory 2.

The RAM 11 temporarily stores data received from the host until the data is stored in the non-volatile memory 2 or temporarily stores data read from the non-volatile memory 2 until the data is transmitted to the host. The RAM 11 is, for example, a general-purpose memory such as an SRAM (static random access memory) and a DRAM (dynamic random access memory).

FIG. 1 illustrates a configuration example where the memory controller 1 includes the ECC circuit 14 and the memory interface 15. However, the ECC circuit 14 may be incorporated into the memory interface 15. Further, the ECC circuit 14 may be incorporated into the non-volatile memory 2.

In a case where a write request is received from the host, the memory controller 1 operates as follows. The processor 12 causes write data to be temporarily stored in the RAM 11. The processor 12 reads the data stored in the RAM 11 and inputs the data to the ECC circuit 14. The ECC circuit 14 encodes the inputted data and provides a code word to the memory interface 15. The memory interface 15 writes the inputted code word in the non-volatile memory 2.

In a case where a read request is received from the host, the memory controller 1 operates as follows. The memory interface 15 provides a code word read from the non-volatile memory 2 to the ECC circuit 14. The ECC circuit 14 decodes the inputted code word and stores the decoded data in the RAM 11. The processor 12 transmits the data stored in the RAM 11 to the host via the host interface 13.

(Schematic Configuration of Non-Volatile Memory)

Figure 2:
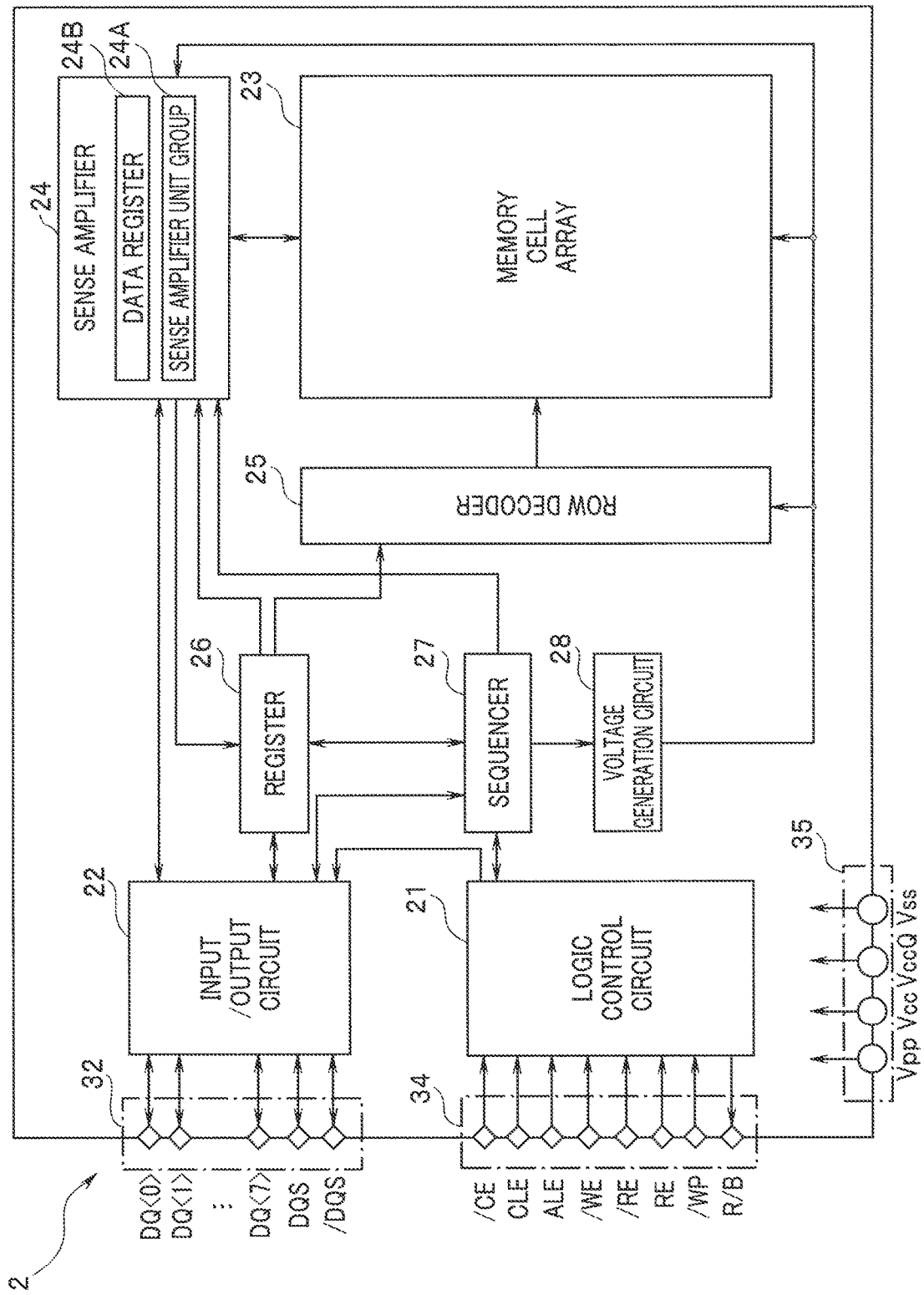
FIG. 2 is a block diagram illustrating a configuration example of a non-volatile memory 2 of the present embodiment.

FIG. 2 is a block diagram illustrating a configuration example of the non-volatile memory of the present embodiment.

The non-volatile memory 2 includes a logic control circuit 21, an input/output circuit 22, a memory cell array 23, a sense amplifier 24, a row decoder 25, a register 26, a sequencer 27, a voltage generation circuit 28, an input/output pad group 32, a logic control pad group 34, and a power source inputting terminal group 35.

The input/output pad group 32 includes a plurality of terminals (pads) that support a signal DQ<7:0> and data strobe signals DQS,/DQS to transmit/receive respective signals including data to/from the memory controller 1.

The logic control pad group 34 includes a plurality of terminals (pads) that support a chip enable signal/CE, a command latch enable signal CLE, an address latch enable signal ALE, a write enable signal/WE, read enable signals RE,/RE, a write protect signal/WP and a signal R/B to transmit/receive respective signals to/from the memory controller 1. Note that "/" added to signal name indicates active-low.

The signal/CE is a signal for selecting and enabling a specific memory chip in a case where the non-volatile memory 2 includes a plurality of memory chips. The signal CLE enables a command to be transmitted as a signal DQ to be latched to a command register. The signal ALE enables an address to be transmitted as the signal DQ to be latched to an address register. The signal/WE enables write. The signals RE,/RE enable read. The signal/WP prohibits write and erase. The signal R/B indicates whether the non-volatile memory 2 is in a ready state (a state where a command can be accepted from outside) or a busy state (a state where a command cannot be accepted from outside). The memory controller 1 can know a state of the non-volatile memory 2 by receiving the signal R/B.

The power source inputting terminal group 35 includes a plurality of terminals that input power source voltages Vcc, VccQ and Vpp and a ground voltage Vss to supply various operation power sources to the non-volatile memory 2 from outside. The power source voltage Vcc is a circuit power source voltage to be typically provided from outside as an operation power source, and is, for example, a voltage of approximately 3.3 V. The power source voltage VccQ is, for example, a voltage of 1.2 V. The power source voltage VccQ is used to transmit/receive signals between the memory controller 1 and the non-volatile memory 2. The power source voltage Vpp is a power source voltage higher than the power source voltage Vcc and is, for example, a voltage of 12 V.

The logic control circuit 21 and the input/output circuit 22 are connected to the memory controller 1 via a NAND bus. The input/output circuit 22 transmits/receives a signal DQ (for example, DQ0 to DQ7) to/from the memory controller 1 via the NAND bus.

The logic control circuit 21 receives external control signals (for example, a chip enable signal/CE, a command latch enable signal CLE, an address latch enable signal ALE, a write enable signal/WE, read enable signals RE,/RE, and a write protect signal/WP) from the memory controller 1 via the NAND bus. Further, the logic control circuit 21 transmits a ready/busy signal R/B to the memory controller 1 via the NAND bus.

The register 26 includes a command register, an address register, a status register, and the like. The command register temporarily stores a command. The address register temporarily stores an address. The status register temporarily stores data necessary for operation of the non-volatile memory 2. The register 26 is constituted with, for example, an SRAM.

The sequencer 27 as the control circuit includes a register that is not illustrated. The sequencer 27 receives a command from the register 26 and controls the non-volatile memory 2 in accordance with a sequence based on the command.

The voltage generation circuit 28 receives a power source voltage from outside of the non-volatile memory 2 and generates a plurality of voltages necessary for write operation, read operation and erase operation using the power source voltage. The voltage generation circuit 28 supplies the generated voltage to the memory cell array 23, the sense amplifier 24, the row decoder 25, and the like.

The row decoder 25 receives a row address from the register 26 and decodes the row address. The row decoder 25 performs operation of selecting a word line on the basis of the decoded row address. Then, the row decoder 25 transfers a plurality of voltages necessary for write operation, read operation and erase operation to the selected block.

The sense amplifier 24 receives a column address from the register 26 and decodes the column address. The sense amplifier 24 includes a sense amplifier unit group 24A connected to bit lines, and the sense amplifier unit group 24A selects one of the bit lines on the basis of the decoded column address. Further, the sense amplifier unit group 24A detects and amplifies data read to the bit lines from the memory cell transistors upon read of the data. Further, the sense amplifier unit group 24A transfers write data to the bit lines upon write of the data.

The sense amplifier 24 includes a data register 24B, and the data register 24B temporarily stores the data detected by the sense amplifier unit group 24A upon read of the data and transfers the data to the input/output circuit 22 in a serial manner. Further, the data register 24B temporarily stores the data transferred from the input/output circuit 22 in a serial manner upon write of the data and transfers the data to the sense amplifier unit group 24A. The data register 24B is constituted with an SRAM, or the like.

The memory cell array 23 includes a plurality of blocks BLK. Each of the plurality of blocks BLK includes a plurality of memory cell transistors (memory cells). In the memory cell array 23, a plurality of bit lines, a plurality of word lines and source lines, and the like, are disposed to control voltages to be applied to the memory cell transistors.

(Block Configuration of Memory Cell Array)

Figure 3:
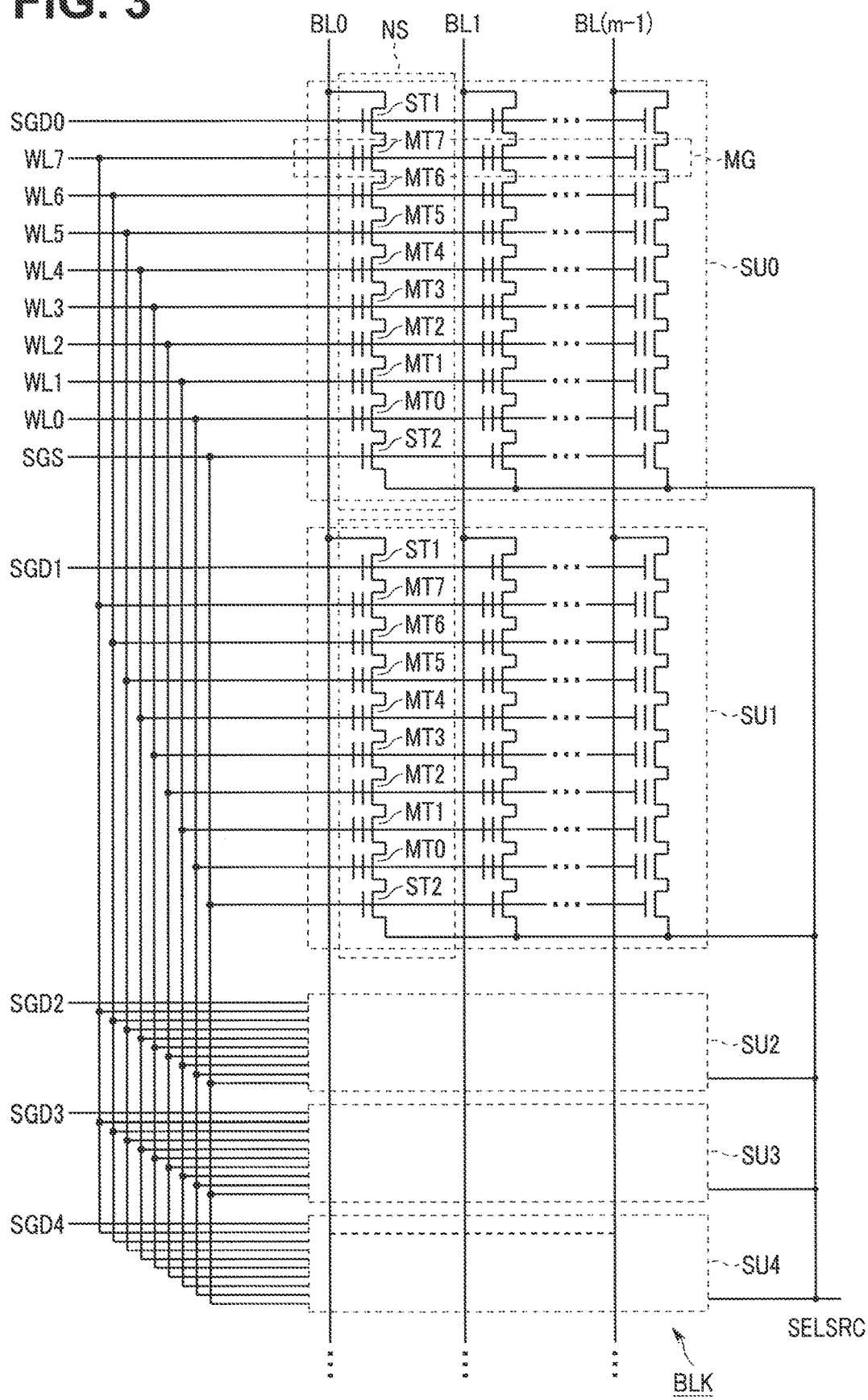
FIG. 3 is a view illustrating an equivalent circuit of a block BLK of a NAND memory cell array 23 having a three-dimensional structure in the non-volatile memory 2 of the present embodiment.

FIG. 3 is a view illustrating an equivalent circuit of a block BLK of the NAND memory cell array 23 having a three-dimensional structure in the non-volatile memory 2 of the present embodiment. FIG. 3 illustrates one block BLK among a plurality of blocks that constitute the memory cell array 23. Other blocks of the memory cell array 23 have a configuration similar to the configuration in FIG. 3. Note that the present embodiment is also applicable to a memory cell array having a two-dimensional structure.

As illustrated, the block BLK includes, for example, five string units (SU0 to SU4). Note that the number of strings is flexible in accordance with capacity and a chip size. To describe the present invention, five string units will be described as an example. Further, each of the string units SU includes a plurality of NAND strings NS. Each of the NAND strings NS includes eight memory cell transistors MT (MT0 to MT7) and select gate transistors ST1 and ST2 here. Note that while the number of the memory cell transistors MT included in the NAND string NS is eight here, the NAND string NS may include a larger number of memory cell transistors MT. While the select gate transistors ST1 and ST2 are illustrated as one transistor on an electronic circuit, a structure of the select gate transistors ST1 and ST2 may be the same as the structure of the memory cell transistors. Further, a plurality of select gate transistors may be respectively used as the select gate transistors ST1 and ST2. Still further, dummy cell transistors may be provided between the memory cell transistors MT and the select gate transistors ST1 and ST2.

The memory cell transistors MT are disposed so as to be connected in series between the select gate transistors ST1 and ST2. The memory cell transistor MT7 on one end side (bit line side) is connected to the select gate transistor ST1, and the memory cell transistor MT0 on the other end side (source line side) is connected to the select gate transistor ST2.

Gates of the select gate transistors ST1 of the string units SU0 to SU4 are respectively connected to select gate lines SGD0 to SGD4 (hereinafter, collectively referred to as a select gate line SGD). On the other hand, gates of the select gate transistors ST2 are connected in common to the same select gate line SGS among the plurality of string units SU in the same block BLK.

Gates of the memory cell transistors MT0 to MT7 in the same block BLK are respectively connected in common to word lines WL0 to WL7. In other words, while the word lines WL0 to WL7 are common among the plurality of string units SU0 to SU4 in the same block BLK, the select gate lines SGD are independent for each of the string units SU0 to Su4 even in the same block BLK. Gates of the memory cell transistors MTi in the same row in the block BLK are connected to the same word line WLi. Note that in the following description, there is a case where the NAND string NS will be simply referred to as a "string".

Each NAND string NS is connected to the corresponding bit line. Thus, each memory cell transistor MT is connected to the bit line via the select gate transistors ST1 and ST2 and other memory cell transistors MT included in the NAND string NS. Data of the memory cell transistors MT in the same block BLK is collectively erased. On the other hand, read and write of data are collectively performed for a plurality of memory cell transistors MT connected in common to one word line WL disposed in one string unit SU. A set including such memory cell transistors MT sharing the word line WL within one string unit SU will be referred to as a memory cell group MG.

Write operation and read operation to be performed on the memory cell group MG is executed in page unit. For example, in a case where each cell is a TLC capable of storing data of three bits (eight values), one memory cell group MG can store data corresponding to three pages. Three bits that can be stored by each memory cell transistor MT respectively correspond to the three pages.

(Three-Dimensional Structure of Memory Cell Array)

Figure 4:
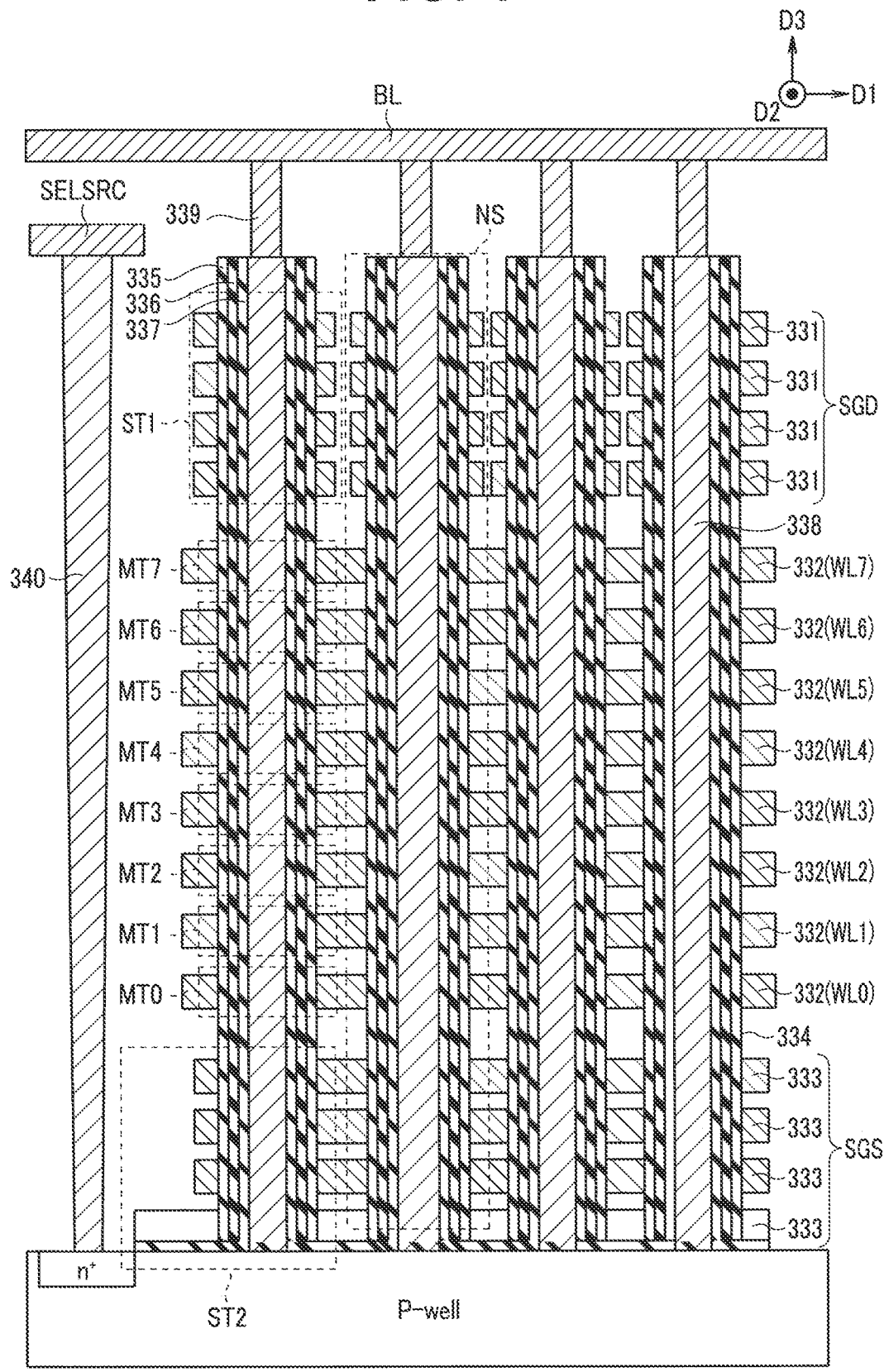
FIG. 4 is a cross-sectional diagram of a partial area of the NAND memory cell array having a three-dimensional structure.

FIG. 4 is a cross-sectional diagram of a partial area of the NAND memory cell array having a three-dimensional structure. As illustrated in FIG. 4, a plurality of NAND strings NS are formed in a D1 direction on a p-well region. In other words, a plurality of wiring layers 333 functioning as the select gate lines SGS, a plurality of wiring layers 332 functioning as word lines WLi, and a plurality of wiring layers 331 functioning as the select gate lines SGD are stacked on the p-well region.

Further, memory holes 334 that pierce the wiring layers 333, 332 and 331 and reach the p-well region are formed. Block insulating films 335, charge accumulation layers (charge storage regions) 336 and gate insulating films 337 are sequentially formed on side surfaces of the memory holes 334, and further, semiconductor columns 338 are embedded into the memory holes 334. The semiconductor column 338 is formed with, for example, polysilicon and functions as a region in which a channel is formed upon operation of the memory cell transistors MT and the select gate transistors ST1 and ST2 included in the NAND string NS. In other words, the wiring layer 331, the semiconductor column 338 and the films 335 to 337 between the wiring layer 331 and the semiconductor column 338 respectively function as the select gate transistor ST1, the wiring layer 332, the semiconductor column 338 and the films 335 to 337 between the wiring layer 332 and the semiconductor column 338 respectively function as the memory cell transistor MT, and the wiring layer 333, and each semiconductor column 338, and the films 335 to 337 between the wiring layer 333 and each semiconductor column 338 function as the select gate transistor ST2.

Note that while FIG. 4 illustrates a case where the memory holes 334 and the semiconductor columns 338 have a columnar shape having the same diameter, actually, the memory holes 334 and the semiconductor columns 338 have a tapered shape that becomes thinner toward the p-well region. Further, depending on manufacturing process, there is also a case where the memory holes 334 and the semiconductor columns 338 have a tapered shape that has a plurality of steps, becomes thicker in the middle of the tapered shape and becomes thinner again toward the p-well region.

In each NAND string NS, the select gate transistor ST2, a plurality of memory cell transistors MT and the select gate transistors ST1 are sequentially formed on the p-well region. Above (in a D3 direction) the semiconductor column 338, a wiring layer functioning as the bit lines BL is formed. Contact plugs 339 that connect the semiconductor columns 338 and the bit lines BL are formed on upper ends of the semiconductor columns 338.

Further, in a surface of the p-well region, an n+ impurity diffusion layer and a p+ impurity diffusion layer are formed. A contact plug 340 is formed on the n+ impurity diffusion layer, and a wiring layer functioning as a source line CELSRC is formed on the contact plug 340.

A plurality of the above-described configurations illustrated in FIG. 4 are arranged in a depth direction (a D2 direction) of the drawing in FIG. 4, and one string unit SU is formed with an aggregate of a plurality of NAND strings arranged in a line in the depth direction.

(Configuration of String)

Figure 5:
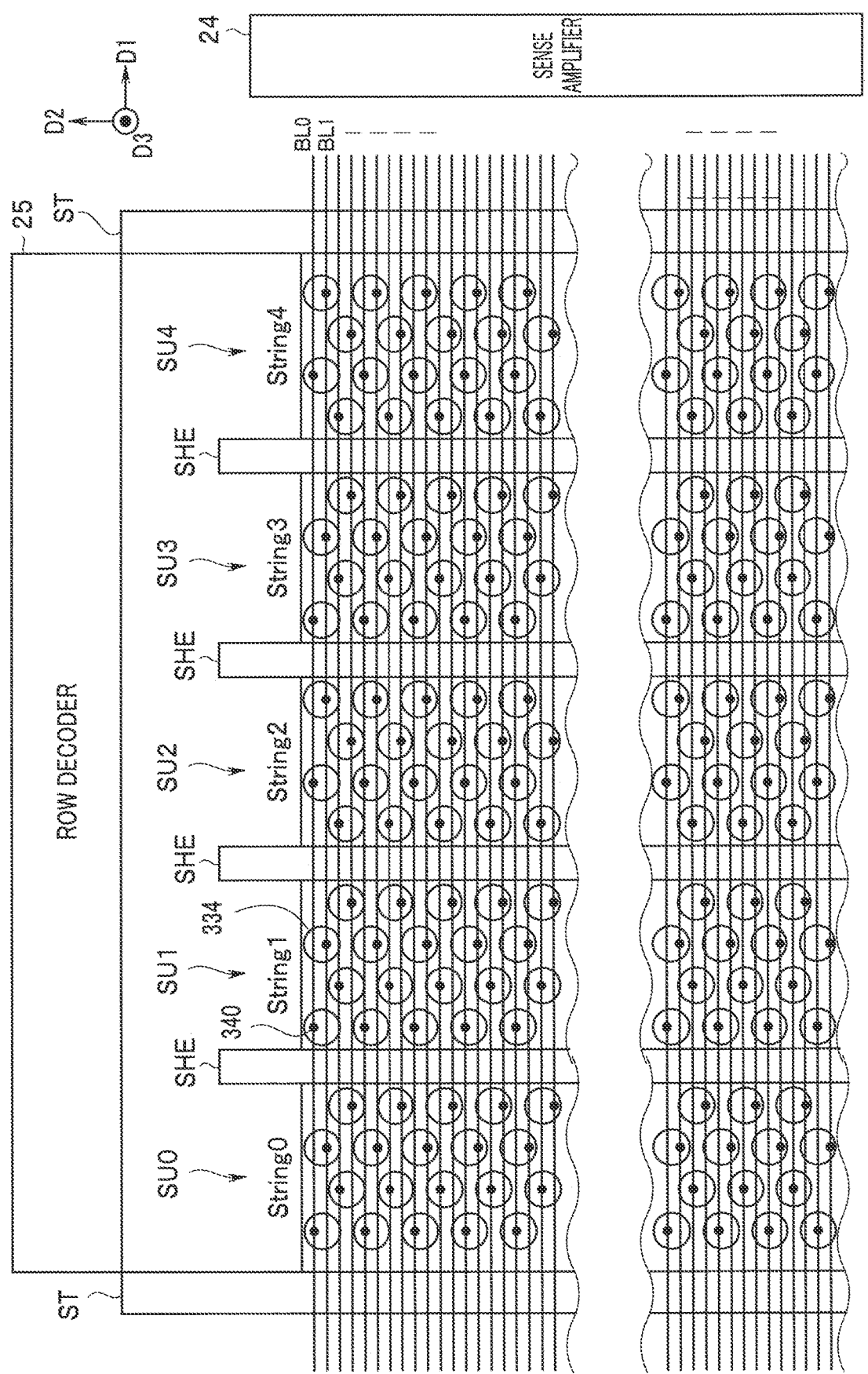
FIG. 5 is an explanatory diagram for explaining arrangement of NAND strings in one block BLK.

FIG. 5 is an explanatory diagram for explaining arrangement of NAND strings in one block BLK. Circles in FIG. 5 indicate the memory holes 334 constituting the NAND string. An insulating layer ST separates one block BLK illustrated in FIG. 5 from other blocks BLK. FIG. 5 illustrates an example where five string units SU0 to SU4 separated by insulating layers SHE are constituted within one block BLK. The insulating layers SHE extend to the wiring layer 331 that constitutes the select gate line SGD and separate the respective string units SU0 to Su4 from one another.

Each NAND string included in the string unit SU0 in FIG. 5 will be referred to as String 0, each NAND string included in the string unit SU1 will be referred to as String 1, each NAND string included in the string unit SU2 will be referred to as String 2, each NAND string included in the string unit SU3 will be referred to as String 3, and each NAND string included in the string unit SU4 will be referred to as String 4. Note that String 0 to String 4 will be collectively referred to as String.

A plurality of memory holes 334 that constitute the NAND string are disposed in one string unit SU, and the memory holes 334 within one string unit are respectively connected to bit lines BL0, BL1, . . . by the contact plugs 340. The bit lines BL0, BL1, . . . are respectively connected to five strings String 0 to String 4. Each string unit SU includes m NAND strings respectively corresponding to the bit lines BL0 to BL(m−1).

(Threshold Distribution)

In a case where multivalued data is written in the memory cell transistor MT, a threshold voltage of the memory cell transistor MT is made a value in accordance with a value of the data. If a program voltage VPGM and a bit line voltage VBL are applied to the memory cell transistor MT, electrons are injected to the charge accumulation film 336, and the threshold voltage increases. The threshold voltage of the memory cell transistor MT can be made higher by increasing the program voltage VPGM to increase an injection amount of electrons. However, even if the same program voltage VPGM is applied, an injection amount of electrons varies for each of the memory cell transistors MT due to variation in the memory cell transistors MT. The electrons injected once are stored until erase operation is performed. Thus, program operation and verify operation (loop) are performed a plurality of times while the program voltage VPGM is gradually increased so as not to exceed a range of the threshold voltage (hereinafter, referred to as a target region) that can be allowed as the threshold voltage to be set to each memory cell transistor MT.

Then, after the program operation, verify operation of determining whether or not the threshold voltage of the memory cell transistor reaches the target region is performed by reading data. By repeating a combination of the program operation and the verify operation described above, the threshold voltage of the memory cell transistor is increased to the target region. It is prohibited to perform write in the memory cell transistor for which it is determined by the verify operation that the threshold voltage reaches the target region, that is, the threshold voltage exceeds a target level that is a lowest value of the target region, after the determination.

Figure 6:
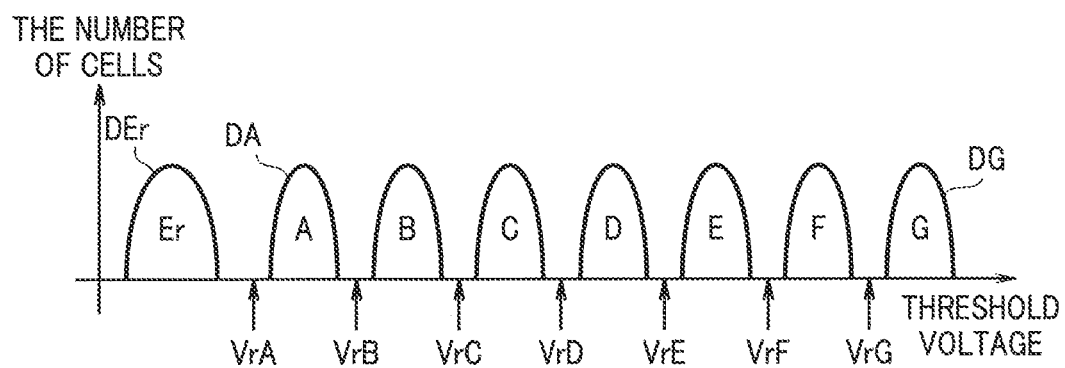
FIG. 6 is a view illustrating threshold distribution of a memory cell array, indicating a threshold voltage on a horizontal axis and indicating the number of memory cell transistors (the number of cells) on a vertical axis.

FIG. 6 is a view illustrating threshold distribution of the memory cell array, indicating the threshold voltage on a horizontal axis and indicating the number of memory cell transistors (the number of cells) on a vertical axis. FIG. 6 indicates a threshold distribution example of the non-volatile memory 2 of three bits/cell. In the non-volatile memory 2, the threshold voltage of the memory cell transistor MT is set in accordance with each data value of the multivalued data to be stored in the memory cell transistor MT. Injection of the charge amount to the charge accumulation film (charge storage region) 336 is probabilistic, and thus, as illustrated in FIG. 6, the threshold voltages of the respective memory cell transistors MT are statistically distributed.

FIG. 6 indicates threshold distribution in eight lobes DEr, DA, DB, DC, . . . , DG, and a width of the threshold voltage of each region corresponds to each target region. In the example in FIG. 6, it is possible to cause data having eight values (3-bit data) to be stored in the memory cell transistor MT by setting the threshold voltage of the memory cell transistor MT to one of the eight target regions.

In the present embodiment, a target region in which a threshold voltage Vth becomes equal to or less than a voltage VrA in FIG. 6 will be referred to as an erase level (Er level), a target region in which the threshold voltage becomes greater than the voltage VrA and equal to or less than a voltage VrB will be referred to as an A level, a target region in which the threshold voltage becomes greater than the voltage VrB and equal to or less than a voltage VIC will be referred to as a B level, and a target region in which the threshold voltage becomes greater than the voltage VrC and equal to or less than a voltage VrD will be referred to as a C level. Hereinafter, levels from a D level to a G level are set in accordance with the respective voltages in a similar manner as indicated in FIG. 6.

In other words, the level indicates a target region to which a data value to be stored in each memory cell transistor MT corresponds, and in a case of eight values of three bits, the target region can be divided into eight levels from Er, A to G levels. Note that threshold distribution respectively corresponding to Er, A, B, . . . , F, G will be respectively referred to as distribution DEr, DA, DB, . . . , DF, DG. The voltages VrA to VrG are reference voltages that become boundaries between the target regions. Note that in the verify operation, read may be performed by applying the voltages VrA to VrG to the word line WL as verify levels (voltage), and it may be determined that the threshold voltage corresponding to the level has been reached from turn-off of the target memory cell transistor MT.

(Configurations of Sense Amplifier Unit and Data Register)

Figure 7:
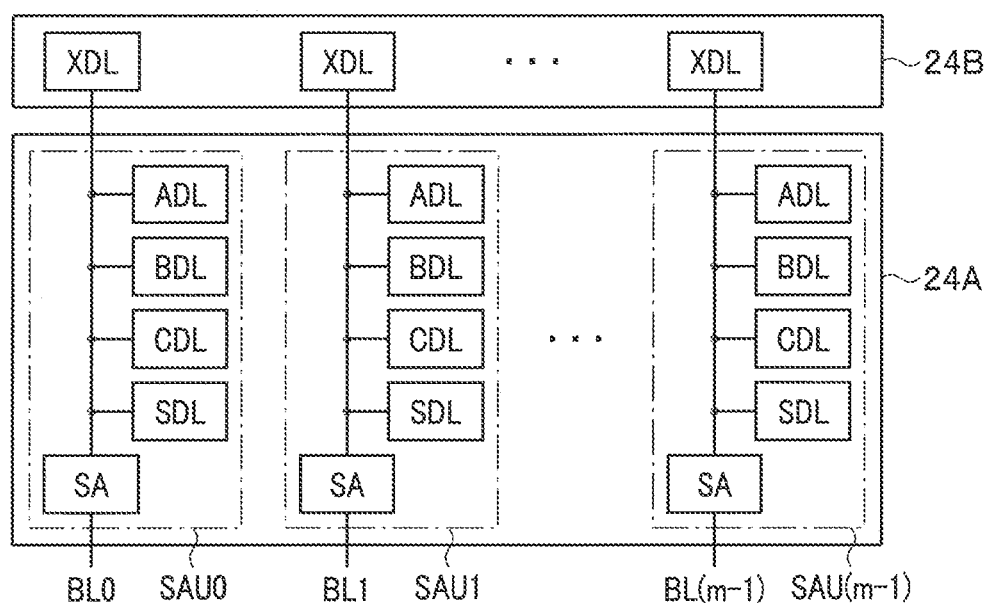
FIG. 7 is a block diagram illustrating an example of a sense amplifier unit group 24A and a data register 24B in FIG. 2.

FIG. 7 is a block diagram illustrating an example of the sense amplifier unit group 24A and the data register 24B in FIG. 2.

The sense amplifier unit group 24A includes sense amplifier units SAU0 to SAU(m−1) (hereinafter, collectively referred to as a sense amplifier unit SAU) corresponding to the bit lines BL0 to BL(m−1). Each sense amplifier unit SAU includes a sense amplifier SA and data latch circuits SDL, ADL, BDL and CDL. The sense amplifier SA and the data latch circuits SDL, ADL, BDL and CDL are connected to one another so as to be able to transfer data.

The data latch circuits SDL, ADL, BDL and CDL temporarily store data. Upon write operation, the sense amplifier SA controls a voltage of the bit line BL in accordance with the data stored in the data latch circuit SDL. The data latch circuits ADL, BDL and CDL are used to multivalued operation in which the memory cell transistor MT stores data of equal to or more than two bits. In other words, the data latch circuit ADL is used to store write data in a Lower page. The data latch circuit BDL is used to store write data in a Middle page. The data latch circuit CDL is used to store write data in an Upper page. The number of data latch circuits provided at the sense amplifier unit SAU is determined in accordance with the number of bits stored in one memory cell transistor MT.

Upon read operation, the sense amplifier SA detects data read in the corresponding bit line BL and determines whether the data is data of 0 or data of 1. Further, upon write operation, the sense amplifier SA applies a voltage to the bit line BL on the basis of the write data.

The data register 24B includes data latch circuits XDL of the number equal to the number of the sense amplifier units SAU0 to SAU(m−1). The data latch circuits XDL are connected to the input/output circuit 22. The data latch circuits XDL temporarily store write data transmitted from the input/output circuit 22 and temporarily store read data transmitted from the sense amplifier unit SAU. More specifically, data transfer between the input/output circuit 22 and the sense amplifier unit group 24A is performed via the data latch circuits XDL corresponding to one page. The write data received by the input/output circuit 22 is transferred to one of the data latch circuits ADL, BDL and CDL via the data latch circuit XDL. The read data read by the sense amplifier SA is transferred to the input/output circuit 22 via the data latch circuit XDL.

(Sense Amplifier)

Figure 8:
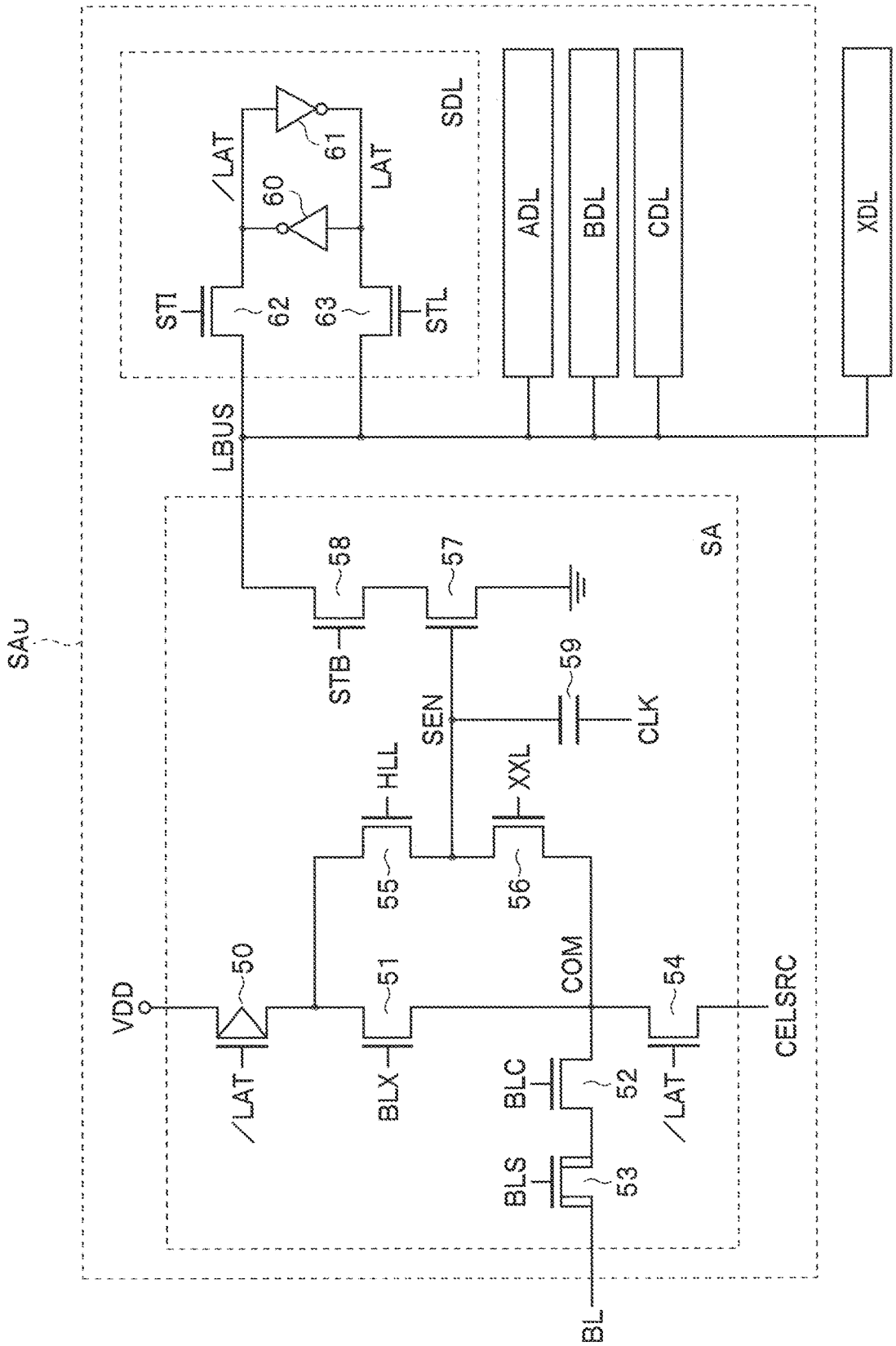
FIG. 8 is a circuit diagram illustrating an example of a specific configuration of a sense amplifier unit SAU in FIG. 7.

FIG. 8 is a circuit diagram illustrating an example of a specific configuration of the sense amplifier unit SAU in FIG. 7.

As illustrated in FIG. 8, the sense amplifier unit SAU includes a sense amplifier unit SA and the data latch circuits SDL, ADL, BDL and CDL. The sense amplifier unit SA and the data latch circuits SDL, ADL, BDL, CDL and XDL are connected with a bus LBUS so as to be able to receive data from one another.

The data latch circuit SDL includes, for example, inverters 60 and 61 and n-channel MOS transistors 62 and 63. An input node of the inverter 60 and an output node of the inverter 61 are connected to a node LAT. An input node of the inverter 61 and an output node of the inverter 60 are connected to a node/LAT. Data of the nodes/LAT and LAT is stored by the inverters 60 and 61. The write data is supplied to the node LAT. The data stored in the node/LAT is inverted data obtained by inverting the data stored in the node LAT.

One end of a drain/source path of the transistor 62 is connected to the node/LAT, and the other end is connected to the bus LBUS. Further, one end of a drain/source path of the transistor 63 is connected to the node LAT, and the other end is connected to the bus LBUS. A control signal STL is input to a gate of the transistor 63, and a control signal STI is input to a gate of the transistor 62.

Note that circuit configurations of the data latch circuits ADL, BDL, CDL and XDL are similar to the configuration of the data latch circuit SDL, and thus, description will be omitted. Note that various kinds of control signals to be supplied to the sense amplifier unit SAU are provided from the sequencer 27.

The sense amplifier unit SA includes, for example, a p-channel MOS transistor 50, n-channel MOS transistors 51 to 58 and a capacitor 59.

The sense amplifier unit SA senses data read to the corresponding bit line BL in read operation and determines whether the read data is "0" or "1". Further, the sense amplifier unit SA sets a voltage value in accordance with write data "0" or "1" to the corresponding bit line BL in program operation.

At the sense amplifier unit SA, the transistors 50 to 54 are involved with the program operation. A source/drain path of the transistor 50 as a second transistor and a source/drain path of the transistor 51 are connected in series between a power source line that supplies a voltage VDD that is an internal power source voltage and a node COM. Further, a drain/source path of the transistor 54 as a third transistor is connected between the node COM and a node CELSRC that supplies a voltage VSS that is a ground voltage. Further, a drain/source path of the transistor 52 as a first transistor and a drain/source path of the transistor 53 are connected in series between the node COM and the bit line BL.

Gates of the transistors 50 and 54 are connected to the node/LAT. Thus, in a case where the node LAT is in a low level (hereinafter, referred to as an L level) in accordance with data of "0", the node/LAT is maintained in a high level (hereinafter, referred to as an H level), and the transistor 50 is in an OFF state, and the transistor 54 is in an ON state. Inversely, in a case where the node LAT is in an H level in accordance with data of "1", the node/LAT is maintained in an L level, and the transistor 50 is in an ON state, and the transistor 54 is in an OFF state.

Upon program operation, control signals HLL and XXL to be respectively supplied to the gates of the transistors 55 and 56 are in an L level, and the transistors 55 and 56 are in an OFF state. A control signal BLX to be supplied to the transistor 51 is in an H level, and the transistor 51 is in an ON state. Further, upon normal program operation, the transistors 52 and 53 are conducting by the control signals BLC and BLS.

Thus, if data of "0" is stored at the node LAT, the transistor 50 is put into an OFF state, and the transistor 54 is put into an ON state, and a bit line voltage such as a voltage VSS (for example, 0 V) is supplied from the node CELSRC to the bit line BL. Further, if data of "1" is stored at the node LAT, the transistor 50 is put into an ON state, and the transistor 54 is put into an OFF state, and, for example, a bit line voltage such as 2.5 V is supplied to the bit line BL in accordance with the control signals BLC and BLS provided to the transistors 52 and 53.

(Verify Operation)

The verify operation is operation of reading data in the memory cell transistor MT and determining whether or not a threshold voltage of the memory cell transistor MT reaches a desired level after the program operation, and the like. Upon the verify operation, all of the transistors 50 to 58 and the capacitor 59 of the sense amplifier unit SA are involved.

A drain/source path of the transistor 55 and a drain/source path of the transistor 56 are connected in series between the drain of the transistor 50 and the node COM. Further, a drain/source path of the transistor 58 and a drain/source path of the transistor 57 are connected in series between the bus LBUS and a reference potential point. The source of the transistor 55 and the drain of the transistor 56 are connected to a sense node SEN, and the sense node SEN is connected to the gate of the transistor 57. Control signals HLL and XXL, a voltage of the sense node SEN or a control signal STB are respectively applied to the gates of the transistors 55 to 58. A clock CLK is applied to the sense node SEN via the capacitor 59.

Upon the verify operation, first, the row decoder 26 applies a voltage VVFY corresponding to a target state (for example, one of voltages VrA to VrG in FIG. 6 or voltages near the voltages VrA to VrG) to a select word line as a verify voltage and applies a non-select read voltage VREAD (for example, 5 to 7 V) higher than the voltages VrA to VrG to a non-select word line.

Upon the verify operation, the sequencer 27 first sets the node/LAT at an L level to turn on the transistor 50. Further, the transistor 51 is turned on by the control signal BLX, and a voltage of the bit line BL is fixed at a constant voltage (for example, 0.5 V) by setting the control signal BLC and the control signal BLS at a predetermined voltage. Further, the sense node SEN is charged to a predetermined precharge voltage Vpre higher than a voltage of the bit line BL by setting the control signal HLL at a predetermined voltage. In this state, if the control signal XXL is made an H level, a current flows from the sense node SEN to the bit line BL via the transistors 56, 52 and 53, and a voltage of the sense node SEN gradually decreases.

The voltage of the sense node SEN changes in accordance with a state of the threshold voltage of a memory cell (select memory cell) to be verified. In other words, in a case where the threshold voltage of the select memory cell is lower than the verify voltage VVFY, the select memory cell is in an ON state, a large cell current flows through the select memory cell, and the voltage of the sense node SEN decreases quickly. Further, in a case where the threshold voltage of the select memory cell is higher than the verify voltage VVFY, the select memory cell is in an OFF state, and a cell current flowing through the select memory cell is small, or a cell current does not flow through the select memory cell, and the voltage of the sense node SEN decreases slowly.

Thus, at a first time point at which a first period has elapsed since discharge of a charge of the sense node SEN had been started, that is, a time point at which the first period has elapsed since the control signal XXL had been set in an H level, if the control signal XXL is set in an L level, and the control signal STB is set in an H level to turn on the transistor 58, the transistor 57 is put into an ON state or an OFF state in accordance with whether the voltage of the sense node SEN is an L level or an H level.

For example, in a case where the select memory cell is a write-insufficient cell, the threshold voltage of the select memory cell is lower than the verify voltage VVFY, and a difference between the threshold voltage and the verify voltage VVFY is large, and thus, the select memory cell is in a complete ON state, and a large cell current flows through the select memory cell. Thus, the voltage of the sense node SEN rapidly decreases, and a voltage drop amount reaches a determination level before the first time point, and at the first time point, the sense node SEN becomes an L level, the transistor 57 is in an OFF state, and a current does not flow through the reference voltage point from the bus LBUS.

Further, in a case where the select memory cell is a write-completion cell, the threshold voltage of the select memory cell is higher than the verify voltage VVFY, and thus, the select memory cell is in an OFF state, and a cell current flowing through the select memory cell is extremely small, or a current does not flow through the select memory cell. Thus, the voltage of the sense node SEN extremely moderately decreases and does not reach the determination level before the first time point, and at the first time point, the sense node SEN is remained in an H level. Thus, the transistor 57 is in an ON state, and a current flows from the bus LBUS to the reference voltage point.

In this manner, the cell can be sorted into a write-insufficient cell or a write-completion cell by whether or not the sense node SEN reaches the determination level. Note that the above-described operation of the sense amplifier unit SA is merely an example, and the sequencer 27 determines whether the cell is a write-insufficient cell or a write-completion cell and controls the sense amplifier unit SAU to set a bit line voltage on the basis of the determination result.

Also in verify (erase-verify) upon erase operation, similar operation is performed, and whether or not the cell is an erase-insufficient cell (erase-verify fail) or an erase-completion cell (erase-verify pass) is determined.

(Row Decoder)

Figure 9:
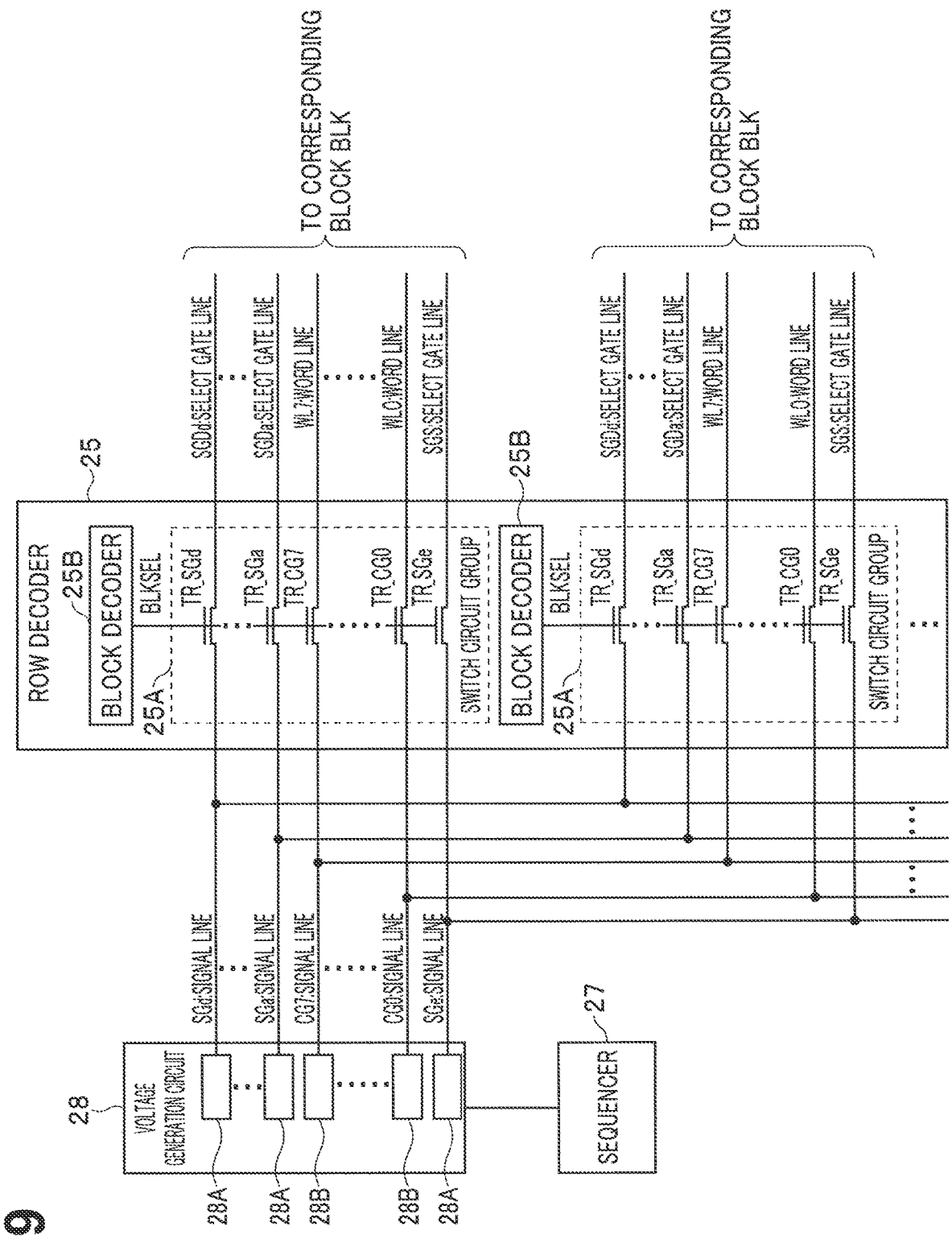
FIG. 9 is a block diagram illustrating an example of a configuration of a row decoder 25 in FIG. 2.

FIG. 9 is a block diagram illustrating an example of a configuration of the row decoder 25 in FIG. 2.

The voltage generation circuit 28 includes a plurality of SG drivers (select gate line drivers) 28A that respectively supply voltages to signal lines SGa to SGe, and a plurality of CG drivers (word line drivers) 28B that respectively supply voltages to signal lines CG0 to CG7. The signal lines SGa to SGe and CG0 to CG7 are made to branch by the row decoder 25 and connected to wirings of respective blocks BLK. In other words, the signal lines SGa to SGd function as global drain side select gate lines and are connected to select gate lines SGDa to SGDd (collectively referred to as a select gate line SGD) as local select gate lines in the respective blocks BLK via the row decoder 25. Note that as described above, the select gate transistor ST1 may be constituted with a plurality of select gate transistors, and FIG. 9 illustrates an example where the select gate transistor ST1 is constituted with four select gate transistors, and gate voltages are applied to gates of the four select gate transistors by the select gate lines SGDa to SGDd.

The signal lines CG0 to CG7 function as global word lines and are connected to word lines WL0 to WL7 as local word lines in the respective blocks BLK via the row decoder 25. The signal line SGe functions as a global source side select gate line and is connected to the select gate line SGS as a local select gate line in each block BLK via the row decoder 25.

The voltage generation circuit 28 generates various kinds of voltages under control by the sequencer 27. The SG driver 28A and the CG driver 28B respectively supply the generated various kinds of voltages to the corresponding signal lines SGa to SGe and signal lines CG0 to CG7. Each SG driver 28A generates a gate voltage to be supplied to the select gate lines SGD and SGS. The gate voltage generated by the SG driver 28A is supplied to gates of the select gate transistors ST1 and ST2. Further, each CG driver 28B selects and supplies voltages such as a voltage VCGRV, a voltage VREAD and a voltage VCG_ER to the corresponding word lines WL in accordance with a target (row address) in the read operation.

The row decoder 25 includes a plurality of switch circuit groups 25A respectively corresponding to the respective blocks, and a plurality of block decoders 25B provided so as to respectively correspond to the plurality of switch circuit groups 25A. Each switch circuit group 25A includes a plurality of transistors TR_SGa to TR_SGd respectively connecting the signal lines SGa to SGd and the select gate lines SGDa to SGDd3, a plurality of transistors TR_CG0 to TR_CG7 respectively connecting the signal lines CG0 to CG7 and the word lines WL0 to WL7, and a transistor TR_SGe connecting the signal line SGe and the select gate line SGS. Each of the transistors TR_SGa to TR_SGe and the transistors TR_CG0 to TR_CG7 is a high withstand voltage transistor.

Each block decoder 25B supplies a block select signal BLKSEL to gates of the transistors TR_SGa to TR_SGe and the transistors TR_CG0 to TR_CG7 in a case where the block decoder 25B is designated by the row address. By this means, at the switch circuit group 25A to which the block select signal BLKSEL is to be supplied from the block decoder 25B designated by the row address, the transistors TR_SGa to TR_SGe and the transistors TR_CG0 to TR_CG7 are put into an ON state and are conducting, and thus, voltages to be supplied from the voltage generation circuit 28 to the signal lines SGa to SGe and the signal lines CG0 to CG7 are supplied to the select gate lines SGDa to SGDd, and SGS and the word lines WL0 to WL7 included in the block BLK for which operation is to be performed.

(Erase Operation)

FIG. 10 to FIG. 13 are explanatory diagrams for explaining comparative examples of erase operation and problems of the comparative examples. FIG. 10 to FIG. 13 indicate memory cell transistors MT connected between the select gate transistor ST1 and the select gate transistor ST2 and driven by the word lines WL0 to WL7 with squares and indicate whether threshold voltages of the respective memory cell transistors MT are in an Er level or A, B, . . . , G levels (hereinafter, the levels will be referred to as a P level) other than the Er level with Er or P in the squares.

Figure 10:
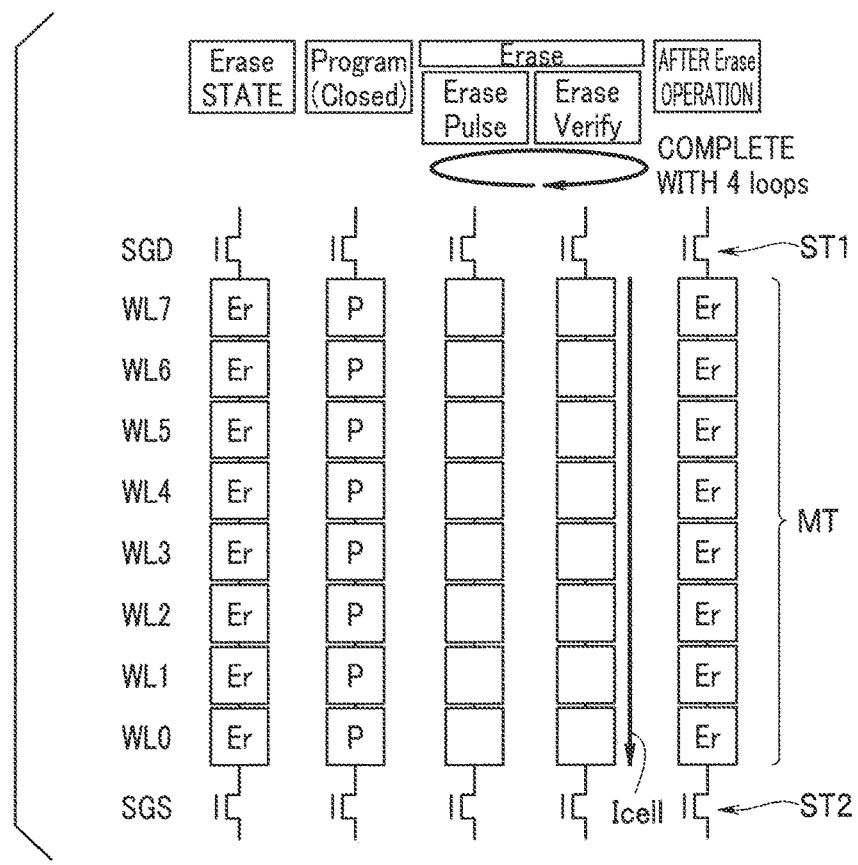
FIG. 10 is an explanatory diagram for explaining a comparative example of erase operation and problems of the comparative example.

FIG. 10 illustrates an erase (Erase) state before program operation, a state (Program (Closed)) after the program operation and a process of erase operation (Erase) and a state after the erase operation (after Erase operation) from the left for the target block BLK. FIG. 10 illustrates an example where all the memory cell transistors MT are in an Er level by the erase operation performed before the program operation.

In the example in FIG. 10, all the memory cell transistors MT are in a P level equal to or higher than an A level by the program operation. Erase operation of returning the threshold voltages of the memory cell transistors MT to an Er level is performed by the sequencer 27 applying a high erase voltage (Erase Pulse) VERA to the source line CELSRC and the bit line BL, for example, in a state where the select transistors ST1 and ST2 are put into an ON state. As a result of electrons disappearing by a channel being filled with a hole generated by a GIDL (gate-induced drain leakage) based on a potential difference between the source line CELSRC and the select gate line SGS and a potential difference between the bit line BL and the select gate line SGD, and a charge accumulated in the charge accumulation film 336 of the memory cell transistor MT and the hole being recoupled, the threshold voltage returns to an Er level (erase level). Further, the SGS side may inject a hole that is a p-well conductive carrier to a channel instead of the hole generated by the GIDL.

Erase-verify is performed after the erase voltage VERA is applied. As described above, in erase-verify, for example, at the sense amplifier unit SA, whether or not the threshold voltage of the memory cell transistor MT becomes an Er level is determined by comparing the voltage of the sense node SEN that detects a cell current Icell with the determination level. The sequencer 27 repeats application of the erase voltage VERA when it is determined that erase is insufficient. Erase operation is performed by repeating a loop of application of the erase voltage VERA and erase-verify a plurality of times. FIG. 10 illustrates a case where all the memory cell transistors MT become an Er level after, for example, erase operation of four loops.

By the way, FIG. 10 illustrates an example of a closed block in which write is performed in all the memory cell transistors MT. In contrast, there is a case where erase operation is performed on a block (hereinafter, referred to as an open block) partially including memory cell transistors MT in which write is not performed.

(Example of Open Block)

Figure 11:
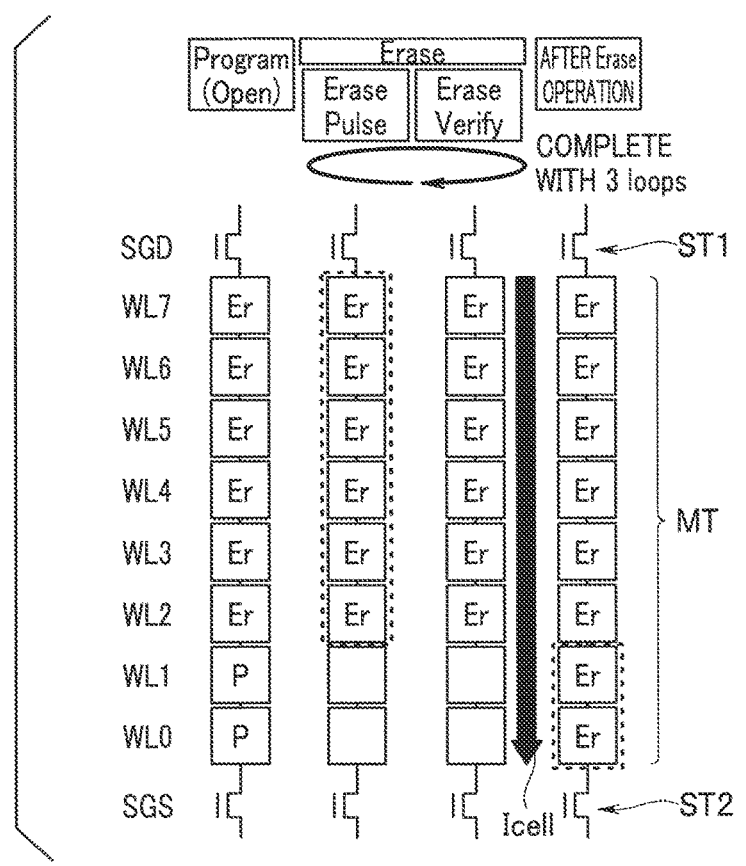
FIG. 11 is an explanatory diagram for explaining a comparative example of erase operation and problems of the comparative example.

FIG. 11 explains erase operation in the above-described case and illustrates an example of an open block in which memory cell transistors MT of an Er level and memory cell transistors MT of a P level are mixed by the program operation. FIG. 11 illustrates a state after the program operation (Program (Open)), a process of erase operation (Erase) and a state after the erase operation (after Erase operation) from the left for the target block BLK.

If the erase voltage VERA is applied to the open block, the threshold voltages of the respective memory cell transistors MT decrease, and threshold voltages of the memory cell transistors MT (dashed frame) that are originally in an Er level further decrease to voltages lower than threshold voltages of the memory cell transistors MT that are in a P level. The cell current Icell upon erase-verify operation becomes greater as a difference between a voltage to be applied to gate of each memory cell transistor MT and the threshold voltage of each memory cell transistor MT is larger. The cell current Icell is affected by all the memory cell transistors MT of the string NS, and thus, the cell current Icell tends to increase as the number of memory cell transistors MT for which the threshold voltages are lower among the string NS is larger. As a result of the threshold voltages of the memory cell transistors MT that are originally in an Er level further decreasing, the cell current Icell upon erase-verify operation is likely to be a current greater than the current upon erase-verify operation in the example in FIG. 10.

As a result, there is a case where the sense node SEN reaches the determination level before the levels of the memory cell transistors MT that are originally in a P level sufficiently decrease to an Er level, which may lead to end of erase operation with fewer loops (in FIG. 11, three loops). In other words, after the erase operation ends, for example, the threshold voltages of the memory cell transistors MT (dashed frames) that are originally in a P level do not sufficiently decrease to an Er level, and there is a possibility that the threshold voltages may become threshold voltages determined as an A level.

Thus, there is a case where pre-program operation of putting all the memory cell transistors MT in the block BLK for which erase is to be performed in a P level is performed before the erase operation.

(Pre-Program Operation)

Figure 12:
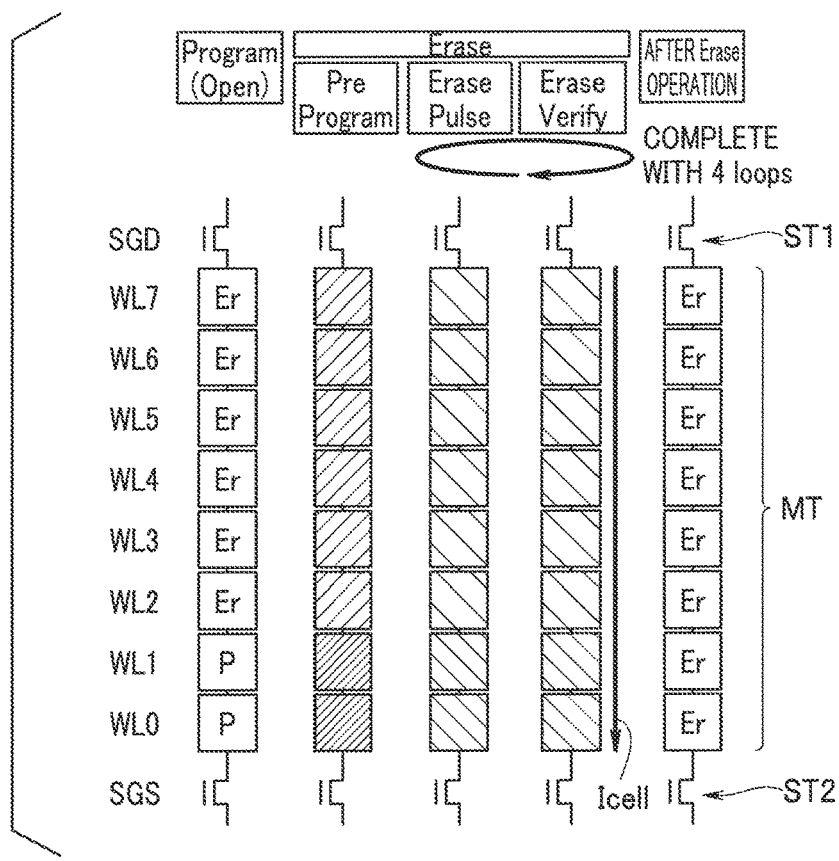
FIG. 12 is an explanatory diagram for explaining a comparative example of erase operation and problems of the comparative example.

FIG. 12 explains erase operation in the above-described case. FIG. 12 illustrates a state after the program operation (Program (Open)), pre-program operation (Pre Program), a process of erase operation (Erase) and a state after the erase operation (after Erase operation) from the left for the target block BLK. The pre-program operation is operation of applying a predetermined write voltage (hereinafter, referred to as a pre-program voltage VPGM) to all the memory cell transistors MT of the string NS to change the levels of the memory cell transistors MT in an Er level to a P level before the erase voltage VERA is applied. FIG. 12 illustrates a case where the pre-program operation is performed in a state where the memory cell transistors MT in an Er level and the memory cell transistors MT in a P level are mixed by the program operation. As a result of the pre-program operation, the levels of all the memory cell transistors MT change to P levels, and a difference between the threshold voltages of the memory cell transistor MT (coarse hatching) that are originally in an Er level and the threshold voltages of the memory cell transistors MT (dense hatching) that are originally in a P level becomes smaller. By this means, the threshold voltages of the respective memory cell transistors MT in the string NS substantially equally decrease by the erase operation. As a result, in a similar manner to the example in FIG. 10, for example, the erase operation is completed with four loops, and the levels of all the memory cell transistors MT reliably become Er levels.

(Stress)

Figure 13:
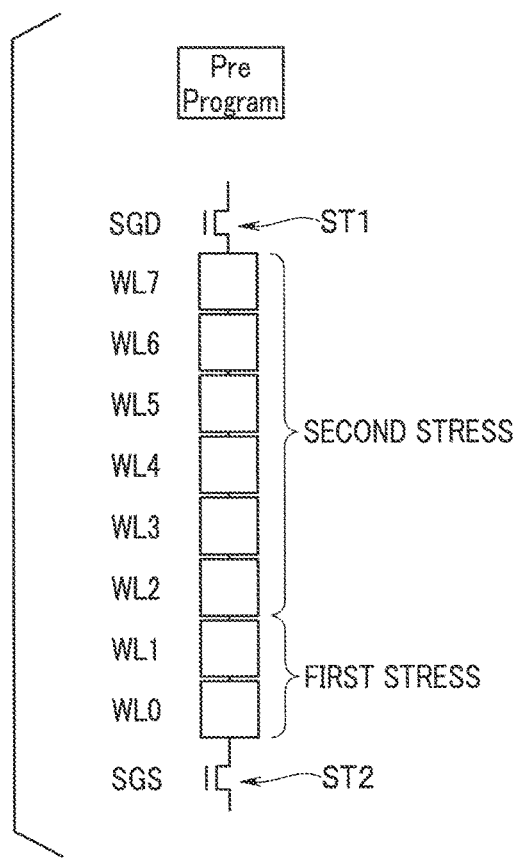
FIG. 13 is an explanatory diagram for explaining a comparative example of erase operation and problems of the comparative example.

FIG. 13 illustrates stress to each memory cell transistor MT in the example in FIG. 12. The pre-program operation provides stress that is not provided for writing and is originally unnecessary to the memory cell transistor MT unlike with write operation for writing data. Particularly, stress (hereinafter, referred to as first stress) greater than stress (hereinafter, referred to as second stress) to be provided to the memory cell transistor MT that is in a P level before the pre-program operation is added to the memory cell transistor MT that is in an Er level before the pre-program operation. Further, in the pre-program operation, the pre-program voltage VPGM is applied to all the memory cell transistors MT of the string NS, and thus, unlike with normal program operation in which a write voltage is applied in individual cells, stress is provided to a channel between the cells, which degrades data retention (loss of data). Thus, for an open block, a defect (hereinafter, referred to as a first defect) due to the second stress and data retention may occur in the memory cell transistor MT that is originally in a P level, and a defect (hereinafter, referred to as a second defect) due to the first stress and data retention may occur in the memory cell transistor MT that is originally in an Er level.

(Countermeasures to Reduce Stress in Comparative Example and Problems)

In the erase operation illustrated in FIG. 11, stress (hereinafter, referred to as double erase stress) increases as a result of erase operation to change the levels of the memory cell transistors MT to Er levels being performed again to the memory cell transistors MT in an Er level.

Further, as described above, in the example in FIG. 11, the threshold voltages of the memory cell transistors MT (dashed frames) that are originally in a P level do not sufficiently decrease to an Er level (hereinafter, referred to as shallow erase), and there is a possibility that the threshold voltages become threshold voltages determined as an A level. Note that such a defect (hereinafter, referred to as a shallow erase defect) is likely to occur in a case where the number of memory cell transistors MT in a P level among the string NS is relatively small.

While the pre-program operation illustrated in FIG. 12 is performed to solve a shallow erase defect, as described above, a problem occurs that extra stress is placed on the memory cell transistor MT by the pre-program operation. Particularly, there is a problem that a second defect that is further greater than a first defect in the memory cell transistor MT that is originally in a P level is likely to occur in the memory cell transistor MT that is originally in an Er level.

In consideration of the above-described problems, a method of setting the pre-program voltage VPGM so that double erase stress and a shallow erase defect do not become obvious is employed in the comparative example.

Figure 14:
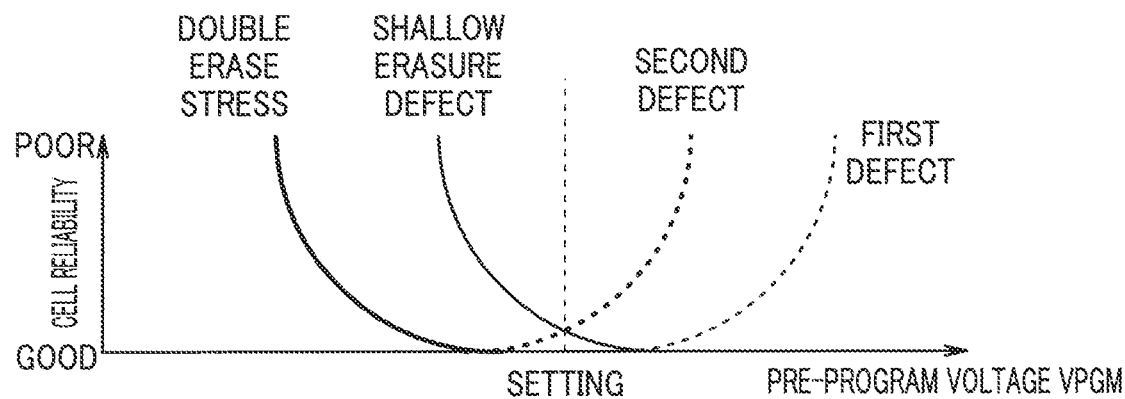
FIG. 14 is a graph for explaining countermeasures in the comparative example, indicating a pre-program voltage VPGM on a horizontal axis and indicating cell reliability on a vertical axis.

FIG. 14 is a graph for explaining countermeasures in the comparative example, indicating the pre-program voltage VPGM on a horizontal axis and indicating cell reliability on a vertical axis. As illustrated in FIG. 14, in a case where the pre-program voltage VPGM is too low, the threshold voltages of the memory cell transistors MT in an Er level do not sufficiently increase even by the pre-program operation, which leads to obvious degradation of reliability due to double erase stress. To solve degradation of reliability due to the double erase stress, it is necessary to use a relatively high pre-program voltage VPGM. Further, in a case where the pre-program voltage VPGM is too low, a difference between the threshold voltages of the memory cell transistors MT in an Er level and the threshold voltages of the memory cell transistors MT in a P level does not become sufficiently small even through the pre-program operation, which leads to obvious degradation of reliability due to a shallow erase defect. To solve degradation of reliability due to the shallow erase defect, it is necessary to use a relatively high pre-program voltage VPGM.

On the other hand, as the pre-program voltage VPGM is higher, the first and the second defects increase, and reliability degrades. As illustrated in FIG. 14, while reliability due to the first defect is relatively favorable even in a case where the pre-program VPGM is relatively high, reliability due to the second defect degrades also in a case where the pre-program voltage VPGM is relatively low. Thus, in the comparative example, in view of factors that limit reliability, for example, the pre-program voltage VPGM indicated at a dashed set position in FIG. 14 is employed. While in the example in FIG. 14, reliability related to the double erase stress and the first defect is favorable, reliability related to the shallow erase defect and the second defect slightly degrades. In other words, it is concerned that a shallow erase defect and data retention may degrade with the countermeasures in the comparative example.

(Countermeasures in the Present Embodiment)

Thus, the present embodiment achieves reliable erase while reducing cell stress by enabling improvement in reliability in a case where a relatively low pre-program VPGM is used by improving a shallow erase defect.

Figure 15:
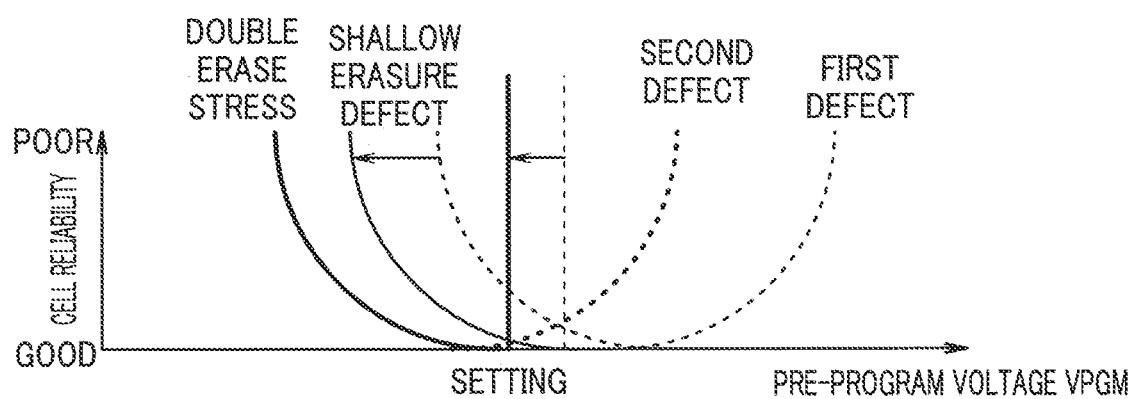
FIG. 15 is a graph for explaining countermeasures in a first embodiment, indicating a pre-program voltage VPGM on a horizontal axis and indicating cell reliability on a vertical axis.

FIG. 15 is a graph for explaining countermeasures of the present embodiment using a notation method similar to the method in FIG. 14, indicating the pre-program voltage VPGM on a horizontal axis and indicating cell reliability on a vertical axis. The present embodiment changes characteristics of a shallow erase defect from characteristics indicated with a dashed line in FIG. 15 (characteristics that are the same as characteristics of the shallow erase defect in FIG. 14) to characteristics indicated with a solid line. By this means, a set position of the pre-program voltage VPGM is changed from a position indicated with a dashed line (the same position as the set position in FIG. 14) to a position indicated with a solid line. In other words, it is possible to prevent a shallow erase defect and prevent degradation of reliability due to the second defect by the setting.

As described above, a shallow erase defect is a phenomenon that erase operation ends before the threshold voltages of the memory cell transistors MT in a P level sufficiently decrease as a result of the threshold voltages of the memory cell transistors MT in an Er level largely decreasing by application of the erase voltage VERA and the cell current Icell increasing. Thus, in the present embodiment, the characteristics in FIG. 15 are achieved by performing control so that erase operation continues until the threshold voltages of all the memory cell transistors MT reliably decrease to an Er level.

(Operation)

Figure 16:
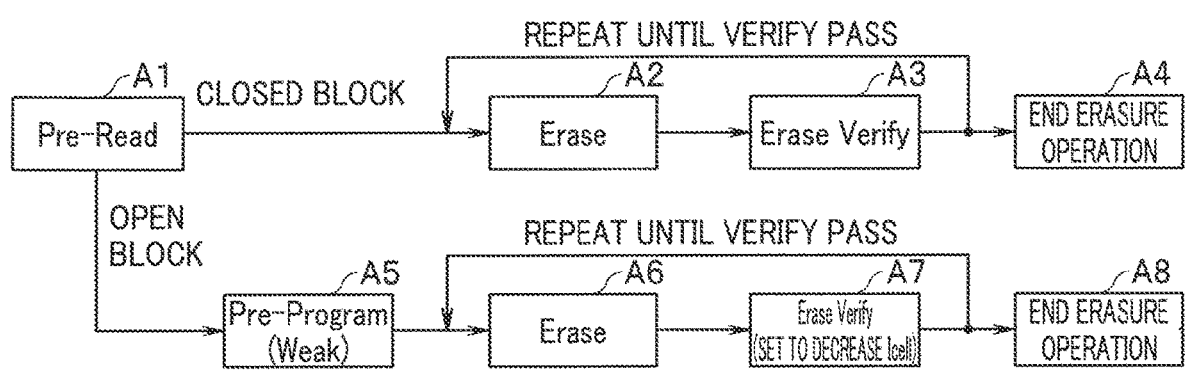
FIG. 16 is a flowchart for explaining control in the first embodiment.

FIG. 16 is a flowchart for explaining control in the present embodiment. Note that the control in FIG. 16 is to be executed by the sequencer 27.

In erase operation to be performed on a closed block illustrated in FIG. 10, pre-program operation is unnecessary. In view of stress by pre-program operation, pre-program had better not be executed on a closed block. Thus, read operation (hereinafter, referred to as a pre-read operation) for verifying whether a block for which erase operation is to be performed is a closed block or an open block is performed. Note that in the pre-read operation, for example, data stored in the memory transistor MT in which write is to be performed with a word line WL to which a program voltage is applied last may be read. In a case where a threshold voltage of the memory cell transistor MT is an Er level from the read data, the sequencer 27 may determine that the block is an open block, otherwise, may determine that the block is a closed block.

The sequencer 27 first executes pre-read operation (A1 in FIG. 16). The sequencer 27 executes a normal erase loop in a case where it is determined that a block for which erase operation is to be performed is a closed block as a result of the pre-read operation. In other words, in a case where the block for which erase operation is to be performed is a closed block, the sequencer 27 applies an erase voltage VERA (Erase) (A2) and executes erase-verify (Erase Verify) (A3). In erase-verify, it is determined whether or not the cell current Icell reaches a current level (hereinafter, referred to as a determination current level) that is determined as erase-verify pass through comparison between a voltage of the sense node SEN of the sense amplifier unit SAU and the determination level. The sequencer 27 repeats application of the erase voltage VERA and the erase-verify operation until the cell current Icell reaches the determination current level. The sequencer 27 determines that erase-verify has been passed in a case where the cell current Icell reaches the determination current level and ends the erase operation (A4).

On the other hand, in a case where it is determined that the block for which erase operation is to be performed is an open block as a result of the pre-read operation, the sequencer 27 executes pre-program (Pre-Program (Weak)) before the erase voltage VERA is applied (A5). In other words, the sequencer 27 applies the pre-program voltage VPGM to all the word lines WL to execute pre-program.

In the present embodiment, as illustrated in FIG. 15, the pre-program voltage VPGM can be set to a voltage value lower than a voltage value in the comparative example indicated in FIG. 14. The sequencer 27 performs erase operation after the pre-program operation. In other words, a loop of application of the erase voltage (A6) and erase-verify (A7) is repeated a plurality of times until erase-verify pass is obtained.

In the present embodiment, increase of the cell current Icell in the erase-verify operation to be performed on an open block is reduced compared to the erase-verify operation to be performed on a closed block. The cell current Icell upon erase-verify operation changes depending on a voltage VBLC of a control signal BLC to be provided to the transistor 52 of the sense amplifier unit SAU. Further, the cell current Icell upon erase-verify operation changes also depending on a voltage to be applied to the gate of the memory cell transistor MT.

Thus, in the present embodiment, the voltage VBLC is made lower upon the erase-verify operation of an open block than the voltage VBLC upon the erase-verify operation to be performed on a closed block. This can reduce increase of the cell current Icell upon the erase-verify operation to be performed on an open block compared to increase of the cell current Icell upon the erase-verify operation to be performed on a closed block. Further, upon the erase-verify operation of an open block, a voltage to be applied to the gate of the memory cell transistor MT is made lower than a voltage to be applied upon the erase-verify operation to be performed on a closed block. This can reduce increase of the cell current Icell upon the erase-verify operation to be performed on an open block compared to increase of the cell current Icell upon the erase-verify operation to be performed on a closed block. Such control makes it difficult for the cell current Icell to reach the determination current level, which can reliably reduce the threshold voltages of the memory cell transistors MT that are originally in a P level to an Er level by application of the erase voltage VERA a plurality of times.

Figure 17:
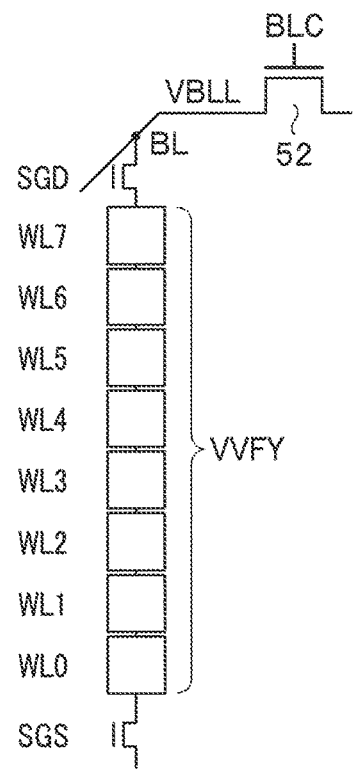
FIG. 17 is an explanatory diagram illustrating a specific example in which a cell current Icell upon erase-verify operation to be performed on an open block is reduced.
Figure 18:
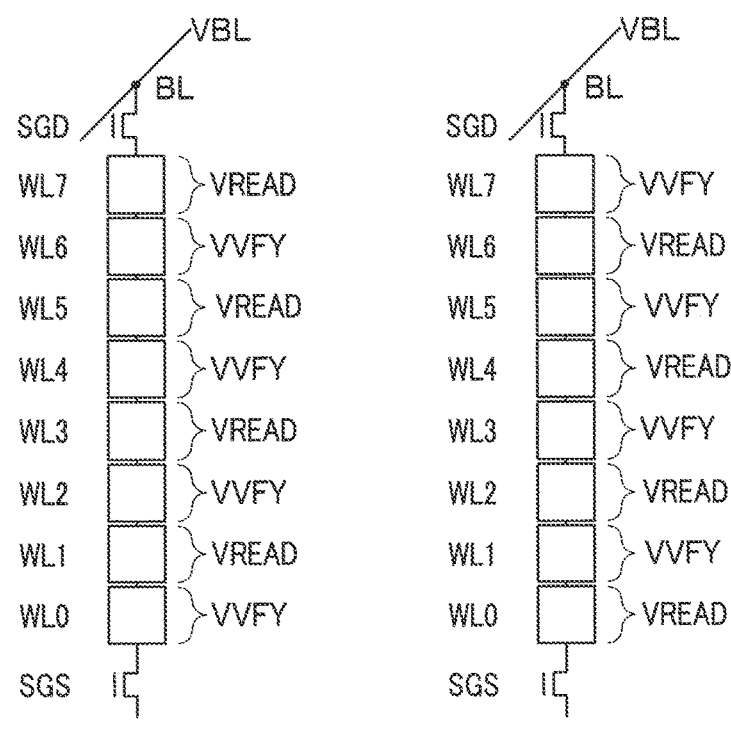
FIG. 18 is an explanatory diagram for explaining erase-verify operation in a comparative example.
Figure 19:
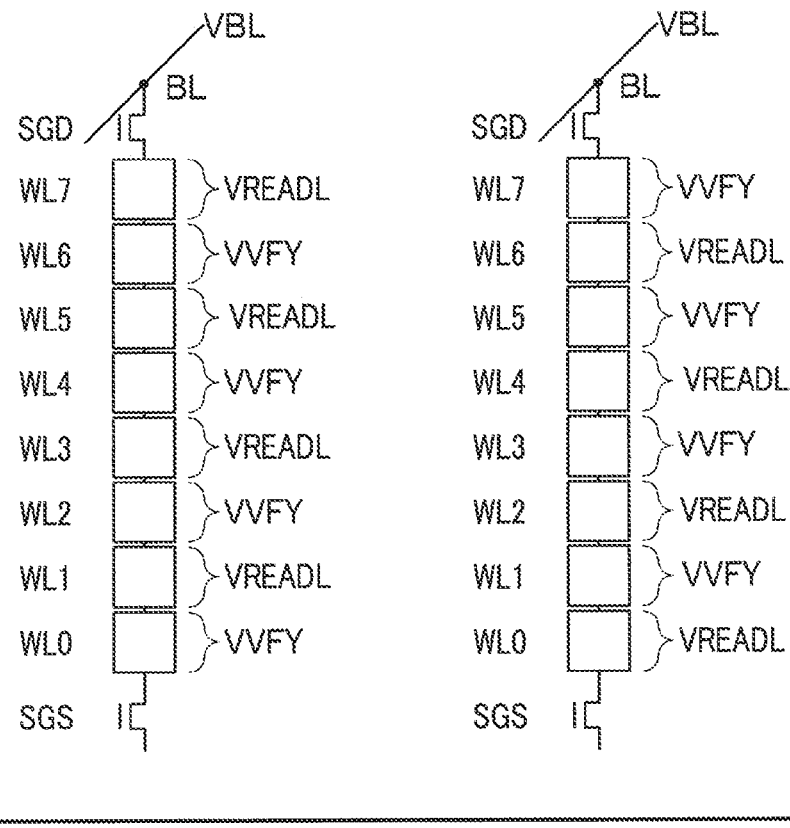
FIG. 19 is an explanatory diagram illustrating a specific example in which a cell current Icell upon erase-verify operation to be performed on an open block is reduced.

FIG. 17 to FIG. 19 are explanatory diagrams illustrating specific examples where the cell current Icell is reduced upon the erase-verify operation to be performed on an open block using a notation method similar to the method in FIG. 10 to FIG. 13. FIG. 17 is an example in a case where the voltage VBLC is made lower upon the erase-verify operation of an open block than the voltage VBLC upon the erase-verify operation to be performed on a closed block. FIG. 18 is an explanatory diagram for explaining erase-verify operation in the comparative example. FIG. 19 is an example in a case where a voltage to be applied to the gate of the memory cell transistor MT is made lower upon the erase-verify operation of an open block than a voltage to be applied upon the erase-verify operation to be performed on a closed block.

As illustrated in FIG. 17, a verify voltage VVFY is applied to the gate of the memory cell transistor MT. Upon the erase-verify operation of an open block, a voltage VBLC to be provided to the transistor 52 in the sense amplifier unit SAU is made lower than a voltage VBLC to be applied upon the erase-verify operation of a closed block. By this means, a voltage of the bit line BL becomes a bit line voltage VBLL that is lower than a bit line voltage VBL upon the erase-verify operation of a closed block. This makes the cell current Icell upon the erase-verify operation of an open block lower than the cell current Icell upon the erase-verify operation of a closed block.

This results in making it difficult for the cell current Icell to reach the determination current level upon the erase-verify operation, which makes it easier to obtain verify fail (difficult to obtain verify pass). Thus, the number of loops of erase operation is likely to increase, which makes it possible to reliably reduce the threshold voltages to Er levels also for the memory cell transistors MT that are originally in a P level.

Further, FIG. 18 and FIG. 19 illustrate an example where the erase-verify operation is separately performed on word lines of even numbers (WL0, WL2, WL4, WL6) and word lines of odd numbers (WL1, WL3, WL5, WL7).

In the comparative example in FIG. 18, similar erase-verify operation is performed on an open block and a closed block. As illustrated in a left part in FIG. 18, upon verify operation to be performed on the word lines of even numbers, the read voltage VREAD for making the memory cell transistors MT connected to the word lines of odd numbers conductive is provided to the word lines of odd numbers, and upon verify operation to be performed on the word lines of odd numbers, as illustrated in a right part in FIG. 18, the read voltage VREAD for making the memory cell transistors MT connected to the word lines of even numbers conductive is provided to the word lines of even numbers.

In the present embodiment, erase-verify operation of a closed block is the same as the erase-verify operation in the comparative example in FIG. 18. In contrast, upon erase-verify operation of an open block, a read voltage VREADL lower than the read voltage VREAD is employed.

In other words, in FIG. 19, upon the verify operation to be performed on the word lines of even numbers, as illustrated in a left part in FIG. 19, the read voltage VREADL for making the memory cell transistors MT connected to the word lines of odd numbers conductive is provided to the word lines of odd numbers, and upon the verify operation to be performed on the word lines of odd numbers, as illustrated in a right part in FIG. 19, the voltage VREADL for making the memory cell transistors MT connected to the word lines of even numbers conductive is provided to the word lines of even numbers. Note that in the example in FIG. 19, the bit line voltage to be applied to the bit line BL is the voltage VBL that is the same as the voltage upon the erase-verify operation to be performed on a closed block.

Note that while there is variation in the threshold voltage among the respective memory cell transistors MT, in a case where the word lines of even numbers and the word lines of odd numbers are separately read as illustrated in FIG. 19, it is advantageous because variation in the threshold voltage among the respective memory cell transistors MT can be reduced by influence of the relatively high read voltage VREADL that is to be applied to the other memory cell transistors MT from which read is not to be performed.

The read voltage VREADL to be applied to the memory cell transistors MT from which read is not to be performed is lower than the read voltage VREAD upon the erase-verify operation of a closed block, and thus, a difference between the threshold voltage and the read voltage VREADL becomes smaller in the respective memory cell transistors MT, and the cell current Icell upon the erase-verify operation becomes lower than the erase-verify operation of a closed block. This results in making it difficult for the cell current Icell to reach the determination current level upon the erase-verify operation, which makes it easier to obtain verify fail (difficult to obtain verify pass). Thus, the number of loops of erase operation is likely to increase, which can reliably reduce the threshold voltages to Er levels also for the memory cell transistors MT that are originally in a P level.

This can reduce shallow erase defects also in a case where a relatively low pre-program voltage VPGM is employed in A5. Thus, as illustrated in FIG. 15, it is possible to improve reliability as a whole by using a relatively low pre-program voltage VPGM.

In this manner, in the present embodiment, to execute erase operation, it is determined whether the block is an open block or a closed block, and it is made difficult to obtain erase-verify pass for an open block through setting change upon erase-verify. This can reduce shallow erase defect problems, which results in making the pre-program voltage VPGM lower than the pre-program voltage VPGM in the comparative example and enabling improvement of reliability while reducing cell stress.

Second Embodiment

Figure 20:
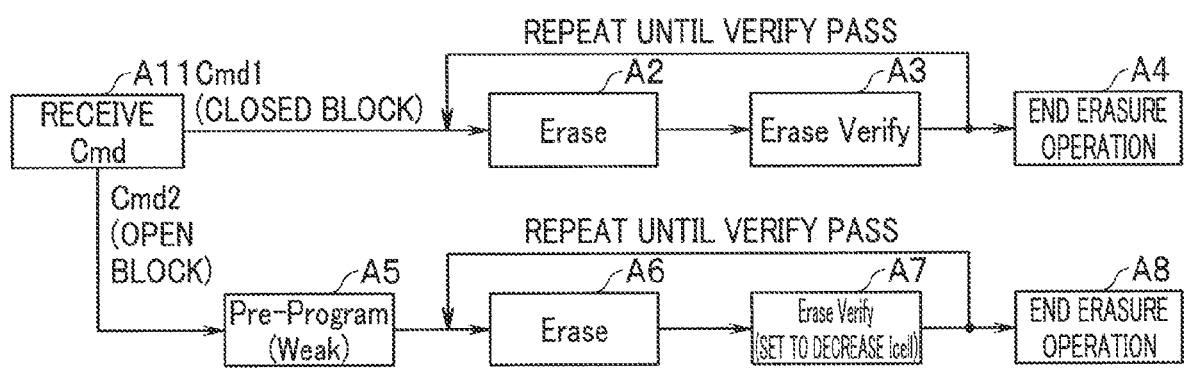
FIG. 20 is a flowchart for explaining control in a second embodiment.

FIG. 20 is a flowchart for explaining control in a second embodiment. In FIG. 20, the same reference numerals will be assigned to processing that is the same as the processing in FIG. 16, and description will be omitted.

In the first embodiment, the flow in FIG. 16 is executed by the sequencer 27 that receives an erase command transmitted by the memory controller 1. In contrast, the present embodiment is an example where the memory controller 1 grasps whether or not a block for which erase is to be performed is an open block or a closed block, and the memory controller 1 transmits each command for designating erase operation to be performed on an open block and erase operation to be performed on a closed block.

The memory controller 1 can transmit commands Cmd1 and Cmd2 as erase commands. For example, the command Cmd1 is a command that gives an instruction to perform erase operation on a closed block, and the command Cmd2 is a command that gives an instruction to perform erase operation on an open block.

The sequencer 27 receives the command (Cmd) transmitted from the memory controller 1 in A11 in FIG. 20. The sequencer 27 determines whether the received command is the command Cmd1 or the command Cmd2. In a case where the received command is the command Cmd1, the sequencer 27 determines that an instruction to perform erase operation on a closed block is given and executes erase operation in A2 and A3. Further, in a case where the received command is the command Cmd2, the sequencer 27 determines that an instruction to perform erase operation on an open block is given and executes erase operation in A5, A6 and A7.

Other operation is similar to the operation in the first embodiment.

In this manner, in the present embodiment, effects similar to the effects in the first embodiment can be obtained. Further, the present embodiment has advantages of being able to omit pre-read operation and shorten a time period required for erase operation.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor storage device comprising:
a first memory block constituted with a plurality of first strings each including a first select transistor, a plurality of first memory cell transistors, and a second select transistor in this order;
a second memory block constituted with a plurality of second strings each including a third select transistor, a plurality of second memory cell transistors, and a fourth select transistor in this order;
a control circuit configured to perform an erase operation on the first memory block and the second memory block;
a first bit line connected to one end portion of one string of the plurality of first strings; and
a second bit line connected to one end portion of one string of the plurality of second strings,
wherein:
when the first memory block is an open block including a memory cell transistor having a threshold of an erase level and the second memory block is a closed block not including the memory cell transistor having the threshold of the erase level, the control circuit changes setting of a first erase-verify operation that is an erase-verify operation included in the erase operation on the first memory block and setting of a second erase-verify operation that is a erase-verify operation included in the erase operation on the second memory block, and
a magnitude of a first cell current that flows through the first bit line upon the first erase-verify operation is smaller than a magnitude of a second cell current that flows through the second bit line upon the second erase-verify operation.

2. The semiconductor storage device according to claim 1, wherein the control circuit changes the magnitudes of the first cell current and the second cell current by control of a first transistor connected to the first bit line and a second transistor connected to the second bit line.

3. The semiconductor storage device according to claim 1, further comprising:
a plurality of first word lines respectively connected to the plurality of first memory cell transistors; and
a plurality of second word lines respectively connected to the plurality of second memory cell transistors,
wherein the control circuit changes the magnitudes of the first cell current and the second cell current by control of a voltage applied to the plurality of first word lines and the plurality of second word lines.

4. The semiconductor storage device according to claim 1, further comprising a plurality of first word lines respectively connected to the plurality of first memory cell transistors,
wherein the control circuit applies a pre-program voltage to the plurality of first word lines before an erase voltage is applied to the first memory block.

5. The semiconductor storage device according to claim 4, wherein the control circuit executes a pre-read operation of determining whether the first memory block is the open block or the closed block before applying the pre-program voltage.

6. The semiconductor storage device according to claim 1, wherein:
when the control circuit divides the first erase-verify operation on the first memory block into at least two operations, and sets at least a part of the first memory block as a third memory block and sets remaining blocks as a fourth memory block, the control circuit comprises:
a plurality of second word lines respectively connected to the plurality of second memory cell transistors;

a plurality of third word lines respectively connected to a plurality of third memory cell transistors included in the third memory block; and a plurality of fourth word lines respectively connected to a plurality of fourth memory cell transistors included in the fourth memory block, and when an erase-verify operation performed on the third memory block is a third erase-verify operation, and an erase-verify operation performed on the fourth memory block is a fourth erase-verify operation:

upon the third erase-verify operation, the control circuit applies, to the plurality of third word lines, a second read voltage lower than a first read voltage applied to the plurality of second word lines upon the second erase-verify operation, and upon the fourth erase-verify operation, the control circuit applies a third read voltage lower than the first read voltage to the plurality of fourth word lines.

7. The semiconductor storage device according to claim 6, wherein the plurality of third memory cell transistors and the plurality of third memory cell transistors are arranged alternately between the first select transistor and the second select transistor.

8. The semiconductor storage device according to claim 6, wherein the second read voltage and the third read voltage are equal.

9. A memory system comprising:
the semiconductor storage device according to claim 1; and
a memory controller configured to transmit, to the semiconductor storage device, an erase operation command including information as to whether the first memory block or the second memory block is the open block or the closed block.

10. A semiconductor storage device comprising:
a first memory block constituted with a plurality of first strings each including a first select transistor, a plurality of first memory cell transistors, and a second select transistor in this order;
a second memory block constituted with a plurality of second strings each including a third select transistor, a plurality of second memory cell transistors, and a fourth select transistor in this order;
a control circuit configured to perform an erase operation on the first memory block and the second memory block;
a first bit line connected to one end portion of one first string of the plurality of first strings; and
a second bit line connected to one end portion of one second string of the plurality of second strings,
wherein:
when the first memory block is an open block including a memory cell transistor having a threshold of an erase level and the second memory block is a closed block not including the memory cell transistor having the threshold of the erase level, the control circuit changes setting of a first erase-verify operation that is an erase-verify operation included in the erase operation on the first memory block and setting of a second erase-verify operation that is a erase-verify operation included in the erase operation on the second memory block, and
a voltage applied to the first bit line upon the first erase-verify operation is lower than a voltage applied to the second bit line upon the second erase-verify operation.

11. A memory system comprising:
the semiconductor storage device according to claim 10; and
a memory controller configured to transmit, to the semiconductor storage device, an erase operation command including information as to whether the first memory block or the second memory block is the open block or the closed block.

12. The semiconductor storage device according to claim 10, further comprising a plurality of first word lines respectively connected to the plurality of first memory cell transistors,
wherein the control circuit applies a pre-program voltage to the plurality of first word lines before an erase voltage is applied to the first memory block.

13. The semiconductor storage device according to claim 10, wherein:
when the control circuit divides the first erase-verify operation on the first memory block into at least two operations, and sets at least a part of the first memory block as a third memory block and sets remaining blocks as a fourth memory block, the control circuit comprises:
a plurality of second word lines respectively connected to the plurality of second memory cell transistors;
a plurality of third word lines respectively connected to a plurality of third memory cell transistors included in the third memory block; and
a plurality of fourth word lines respectively connected to a plurality of fourth memory cell transistors included in the fourth memory block, and
when an erase-verify operation performed on the third memory block is a third erase-verify operation, and an erase-verify operation performed on the fourth memory block is a fourth erase-verify operation:
upon the third erase-verify operation, the control circuit applies, to the plurality of third word lines, a second read voltage lower than a first read voltage applied to the plurality of second word lines upon the second erase-verify operation, and
upon the fourth erase-verify operation, the control circuit applies a third read voltage lower than the first read voltage to the plurality of fourth word lines.

14. A semiconductor storage device comprising:
a first memory block constituted with a plurality of first strings each including a first select transistor, a plurality of first memory cell transistors, and a second select transistor in this order;
a second memory block constituted with a plurality of second strings each including a third select transistor, a plurality of second memory cell transistors, and a fourth select transistor in this order;
a control circuit configured to perform an erase operation on the first memory block and the second memory block;
a first bit line connected to one end portion of one first string of the plurality of first strings;
a first transistor connected to the first bit line;
a second bit line connected to one end portion of one second string of the plurality of second strings; and
a second transistor connected to the second bit line,
wherein:
when the first memory block is an open block including a memory cell transistor having a threshold of an erase level and the second memory block is a closed block not including the memory cell transistor having the threshold of the erase level, the control circuit changes setting of a first erase-verify operation that is an erase-verify operation included in the erase operation on the first memory block and setting of a second erase-verify operation that is a erase-verify operation included in the erase operation on the second memory block, and a voltage applied to a gate of the first transistor upon the first erase-verify operation is lower than a voltage applied to a gate of the second transistor upon the second erase-verify operation.

15. The semiconductor storage device according to claim 14, wherein:

when the control circuit divides the first erase-verify operation on the first memory block into at least two operations, and sets at least a part of the first memory block as a third memory block and sets remaining blocks as a fourth memory block, the control circuit comprises:

a plurality of second word lines respectively connected to the plurality of second memory cell transistors;

a plurality of third word lines respectively connected to a plurality of third memory cell transistors included in the third memory block; and a plurality of fourth word lines respectively connected to a plurality of fourth memory cell transistors included in the fourth memory block, and when an erase-verify operation performed on the third memory block is a third erase-verify operation, and an erase-verify operation performed on the fourth memory block is a fourth erase-verify operation:

upon the third erase-verify operation, the control circuit applies, to the plurality of third word lines, a second read voltage lower than a first read voltage applied to the plurality of second word lines upon the second erase-verify operation, and upon the fourth erase-verify operation, the control circuit applies a third read voltage lower than the first read voltage to the plurality of fourth word lines.

16. A memory system comprising:

the semiconductor storage device according to claim 14; and a memory controller configured to transmit, to the semiconductor storage device, an erase operation command including information as to whether the first memory block or the second memory block is the open block or the closed block.

17. The semiconductor storage device according to claim 14, further comprising a plurality of first word lines respectively connected to the plurality of first memory cell transistors, wherein the control circuit applies a pre-program voltage to the plurality of first word lines before an erase voltage is applied to the first memory block.

* * * * *